US009331099B2

(12) United States Patent
Nimura

(10) Patent No.: US 9,331,099 B2
(45) Date of Patent: May 3, 2016

(54) SUBSTRATE FOR ELECTRO-OPTICAL APPARATUS, ELECTRO-OPTICAL APPARATUS, AND ELECTRONIC EQUIPMENT WITH IMPROVED LIGHT EFFICIENCY AND CONTRAST

(71) Applicant: Seiko Epson Corporation, Tokyo (JP)

(72) Inventor: Toru Nimura, Matsumoto-shi (JP)

(73) Assignee: Seiko Epson Corporation, Tokyo (JP)

( * ) Notice: Subject to any disclaimer, the term of this patent is extended or adjusted under 35 U.S.C. 154(b) by 26 days.

(21) Appl. No.: 14/450,641

(22) Filed: Aug. 4, 2014

(65) Prior Publication Data

US 2015/0041833 A1 Feb. 12, 2015

(30) Foreign Application Priority Data

Aug. 8, 2013 (JP) ................. 2013-164822

(51) Int. Cl.
*H01L 29/18* (2006.01)
*H01L 27/12* (2006.01)
*H01L 29/786* (2006.01)
*G02F 1/1335* (2006.01)
*G02F 1/1362* (2006.01)

(52) U.S. Cl.
CPC ...... *H01L 27/1214* (2013.01); *G02F 1/133526* (2013.01); *G02F 1/136209* (2013.01); *G02F 1/136227* (2013.01); *H01L 27/124* (2013.01); *H01L 27/1218* (2013.01); *H01L 29/78633* (2013.01)

(58) Field of Classification Search
CPC .......... H01L 27/1214; H01L 29/78633; H01L 27/1218; H01L 27/124; G02F 1/133526; G02F 1/136209; G02F 1/136227
USPC ...................................... 257/79–88
See application file for complete search history.

(56) References Cited

U.S. PATENT DOCUMENTS

| | | | |
|---|---|---|---|
| 2002/0021386 A1* | 2/2002 | Yotsuya | G02B 3/0025 349/95 |
| 2004/0141130 A1* | 7/2004 | Kawata | G02F 1/136286 349/139 |
| 2006/0046486 A1* | 3/2006 | Ozawa | G02B 3/0012 438/689 |
| 2006/0138480 A1* | 6/2006 | Adkisson | H01L 27/14625 257/291 |
| 2007/0103624 A1 | 5/2007 | Kim et al. | |
| 2011/0069253 A1* | 3/2011 | Murao | G02F 1/133526 349/62 |
| 2012/0319978 A1* | 12/2012 | Takeuchi | G02F 1/13338 345/173 |

FOREIGN PATENT DOCUMENTS

| | | |
|---|---|---|
| JP | 2000-199916 A | 7/2000 |
| JP | 2004-302380 A | 10/2004 |
| JP | 2007-133373 A | 5/2007 |
| JP | 2008-281669 A | 11/2008 |

* cited by examiner

*Primary Examiner* — Duy T Nguyen
(74) *Attorney, Agent, or Firm* — ALG Intellectual Property, LLC

(57) ABSTRACT

An element substrate is provided with a substrate; a pixel electrode; a light shielding layer which is disposed between the substrate and the pixel electrode and has an opening in an area overlapping with the pixel electrode; a TFT that is disposed between the light shielding layer and the pixel electrode has a channel area which is disposed in an area overlapping with the light shielding layer; a light shielding layer that is disposed between the TFT and the pixel electrode and has an opening in an area overlapping with the pixel electrode; a micro lens that is disposed between the substrate and the light shielding layer and disposed in an area overlapping with the pixel electrode; and a micro lens that is disposed between the light shielding layer and the pixel electrode and disposed in an area overlapping with the pixel electrode.

12 Claims, 12 Drawing Sheets

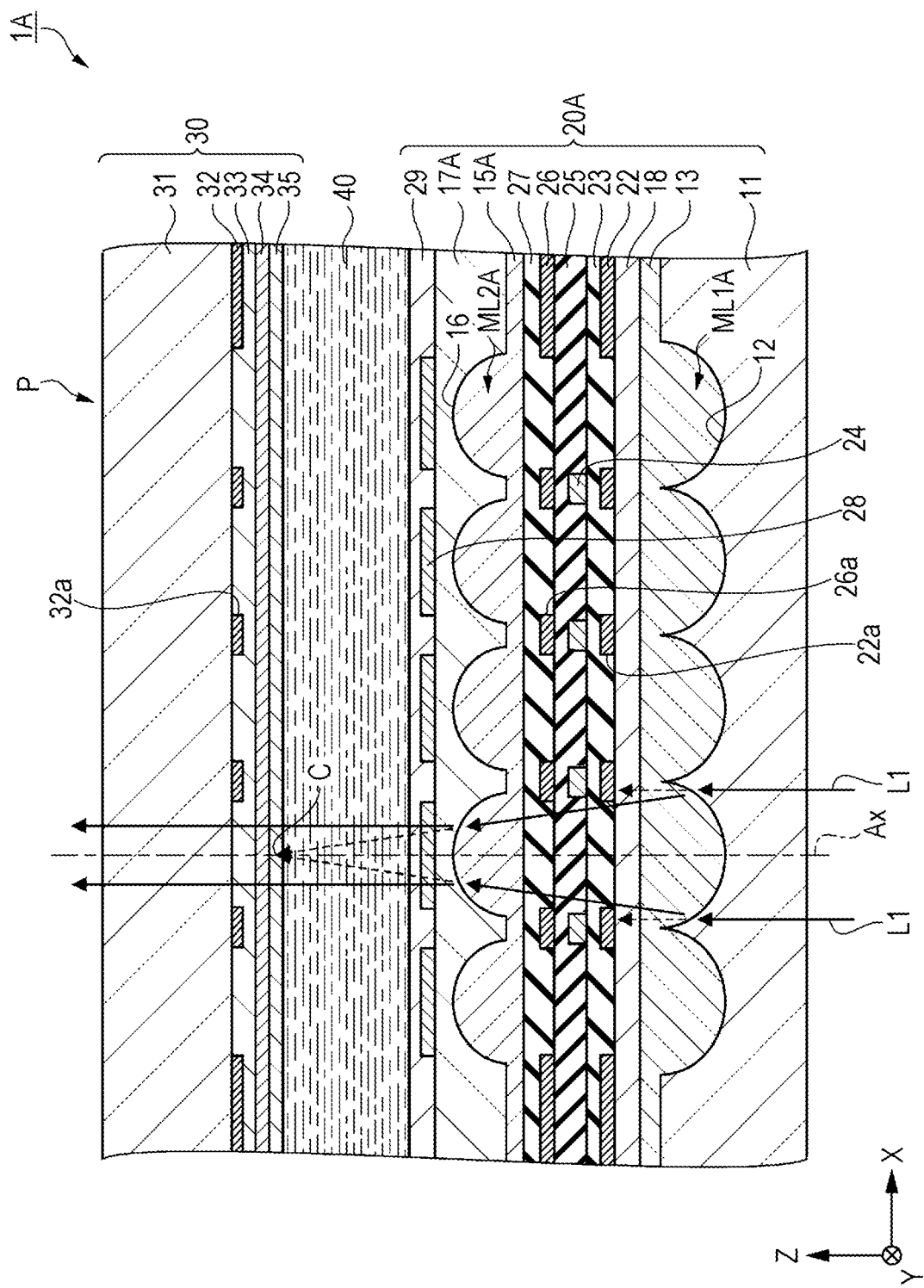

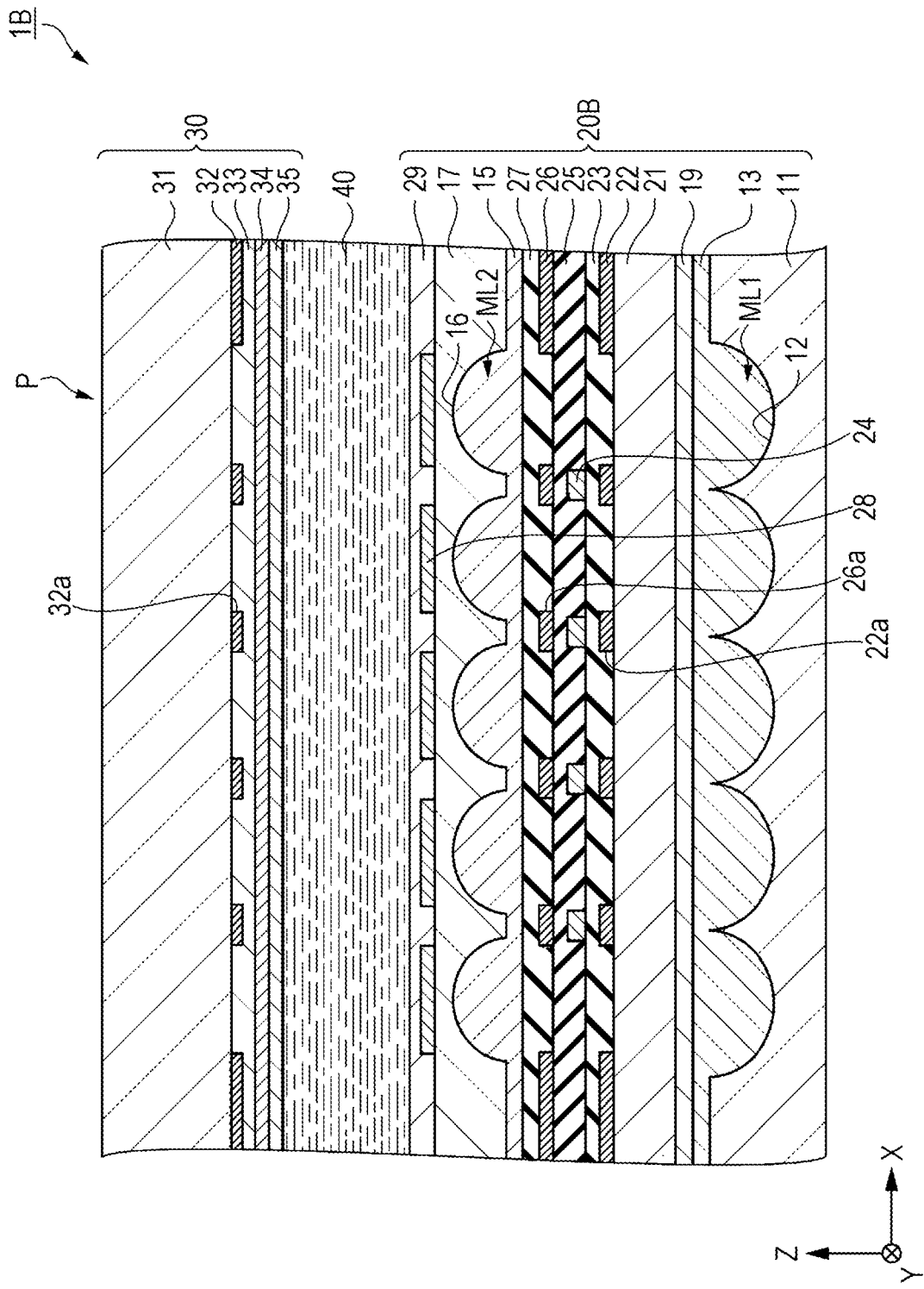

SUBSTRATE FOR ELECTRO-OPTICAL APPARATUS, ELECTRO-OPTICAL APPARATUS, AND ELECTRONIC EQUIPMENT WITH IMPROVED LIGHT EFFICIENCY AND CONTRAST

BACKGROUND

1. Technical Field

The present invention is related to a substrate for electro-optical apparatus, an electro-optical apparatus, and electronic equipment.

2. Related Art

An electro-optical apparatus is well known that an electro optical substance such as a liquid crystal is provided between an element substrate and a counter substrate. As the electro-optical apparatus, a liquid crystal device, which is used as a liquid crystal light valve of a projector, can be exemplified. In the liquid crystal device, a light shielding layer is provided in an area in which a switching element, a wiring, or the like is disposed, and a part of the light to be incident is shielded in the light shielding layer not to be used. Thus, a configuration is well known that a micro lens is provided on one substrate so as to use the light being shielded in the light shielding layer by condensing the light incident on the liquid crystal device.

However, when refractive power of the micro lens is enhanced in order to improve the use efficiency of light, the light, which is condensed in the micro lens and then emitted, radially spreads. When an angle at which the light spreads is larger than an uptake angle of a projection lens, there is a problem in that a vignetting of the projection lens is generated. In order to solve the above described problem, a liquid crystal device including micro lenses on each of the element substrate and the counter substrate has been suggested (for example see JP-A-2008-281669). In the liquid crystal device disclosed in JP-A-2008-281669, the light incident from the micro lens on one side of the substrate is refracted and condensed, and the light transmitting the liquid crystal layer is refracted again in the micro lens on the other side of the substrate so as to be made almost parallel light, thereby suppressing the vignetting of the projection lens.

However, in a case where the liquid crystal device has a configuration in which liquid crystal molecules are arranged in a vertical direction with respect to the substrate as in a vertical alignment (VA), when the refractive power of the micro lens on the incident side is enhanced so as to avoid shielding the light in the light shielding layer, a large amount of the light which is condensed and incident on the liquid crystal layer becomes the light which is obliquely incident to a vertical direction and thus the light intersects the high contrast axis direction of the liquid crystal layer. Due to the phase shift, the oblique light obtained from above causes a decrease in transmittance of the light transmitting the liquid crystal layer, and a reduction in contrast of the liquid crystal device. When the refractive power of micro lens on the incident side is weakened in order to improve the transmittance of the light transmitting the liquid crystal layer and the contrast, an amount of the light which is not used by being shielded in the light shielding layer is increased, thereby causing a decrease in the use efficiency of light. Accordingly, a liquid crystal device is required to have a configuration in which the use efficiency of the incident light is increased while the contrast is improved by reducing the inclination of the optical axis of the emitted light.

SUMMARY

The invention can be realized in the following forms or application examples.

APPLICATION EXAMPLE 1

According to this application example, there is provided a substrate for electro-optical apparatus including: a first substrate; a pixel electrode; a switching element that is provided between the first substrate and the pixel electrode so as to correspond to the pixel electrode, and includes a semiconductor layer having a channel area; a first light shielding layer that is provided between the first substrate and the switching element, and has an opening in an area overlapping with the pixel electrode in planar view to be disposed in an area overlapping with the channel area; a second light shielding layer that is provided between the switching element and the pixel electrode, and has an opening in an area overlapping with the pixel electrode in planar view to be disposed in the area overlapping with the channel area; a first micro lens that is disposed between the first substrate and the first light shielding layer, and is disposed in the area overlapping with the pixel electrode in planar view; and a second micro lens that is disposed between the second light shielding layer and the pixel electrode, and is disposed in the area overlapping with the pixel electrode in planar view.

In this case, the substrate for electro-optical apparatus is configured to have the first micro lens, the first light shielding layer, the switching element, the second light shielding layer, the second micro lens, and the pixel electrode which are disposed in order on the upper layer of the first substrate. For this reason, when the light is incident on the substrate for electro-optical apparatus from the first substrate side, the light is refracted in the first micro lens to pass through the opening in the first light shielding layer, and then refracted again in the second micro lens to be emitted to the pixel electrode side. In addition, when the light is incident on the substrate for electro-optical apparatus from the pixel electrode side, the light is refracted in the second micro lens to pass through the opening in the second light shielding layer, and then refracted again in the first micro lens to be emitted to the first substrate side. Accordingly, the use efficiency of light can be improved by reducing an amount of the light being shielded in the light shielding layer on which the light is incident due to condensing efficiency of the micro lens on which the light is incident and it is possible to reduce the inclination of an optical axis of the light with respect to a vertical direction in the micro lens to which the light is emitted.

Therefore, for example, in a case where an electro-optical layer is disposed on the pixel electrode side of the substrate for electro-optical apparatus, since the inclination of the optical axis of the light incident on the electro-optical layer from the first substrate side with respect to the vertical direction is reduced, the phase shift in the electro-optical layer can be reduced to suppress a decrease in transmittance and contrast. Further, since the light incident on the substrate for electro-optical apparatus from the pixel electrode side transmits the electro-optical layer before being condensed in the second micro lens, the phase shift in the electro-optical layer can be reduced to suppress a decrease in transmittance and contrast.

APPLICATION EXAMPLE 2

In the substrate for electro-optical apparatus according to the application example, it is preferable that the first micro lens have positive refractive power, and the second micro lens have positive refractive power when a focus of the first micro lens is positioned closer to the first substrate side than the second micro lens and have negative refractive power when the focus of the first micro lens is positioned closer to the pixel electrode side than the second micro lens.

In this case, since the first micro lens has the positive refractive power, the light incident from the first substrate side is refracted toward the focus of the first micro lens positioned on the pixel electrode side, thereby reducing an amount of the light being shielded in the first light shielding layer among the incident light. In a case where the focus of the first micro lens is positioned closer to the first substrate side than the second micro lens, the light is incident on the second micro lens so as to radially spread by intersecting at the focus of the first micro lens. In such a case, since the second micro lens has the positive refractive power, the incident light is refracted toward the focus of the second micro lens positioned on the pixel electrode side, thereby emitting the light to the pixel electrode side by reducing the inclination of the optical axis of the light with respect to the vertical direction. Moreover, in a case where the focus of the first micro lens is positioned closer to the pixel electrode side than the second micro lens, the light is incident on the second micro lens so as to be condensed toward the focus of the first micro lens. In such a case, since the second micro lens has the negative refractive power, the incident light is refracted so as to radially spread from the focus of the second micro lens positioned on the first substrate side, thereby emitting the light to the pixel electrode side by reducing the inclination of the optical axis of the light with respect to the vertical direction.

APPLICATION EXAMPLE 3

In the substrate for electro-optical apparatus according to the application example, it is preferable that the second micro lens have positive refractive power, and the first micro lens have positive refractive power when a focus of the second micro lens is positioned closer to the pixel electrode side than the first micro lens and have negative refractive power when the focus of the second micro lens is positioned closer to the first substrate side than the first micro lens.

In this case, since the second micro lens has the positive refractive power, the light incident from the pixel electrode side is refracted toward the focus of the second micro lens positioned on the first substrate side, thereby reducing an amount of the light being shielded in the second light shielding layer among the incident light. In a case where the focus of the second micro lens is positioned closer to the pixel electrode side than the first micro lens, the light is incident on the first micro lens so as to radially spread by intersecting at the focus of the second micro lens. In such a case, since the first micro lens has the positive refractive power, the incident light is refracted toward the focus of the first micro lens positioned on the first substrate side, thereby emitting the light to the first substrate side by reducing the inclination of the optical axis of the light with respect to the vertical direction. Moreover, in a case where the focus of the second micro lens is positioned closer to the first substrate side than the first micro lens, the light is incident on the first micro lens so as to be condensed toward the focus of the second micro lens. In such a case, since the first micro lens has the negative refractive power, the incident light is refracted so as to radially spread from the focus of the first micro lens positioned on the pixel electrode side, thereby emitting the light to the first substrate side by reducing the inclination of the optical axis of the light with respect to the vertical direction.

APPLICATION EXAMPLE 4

In the substrate for electro-optical apparatus according to the application example, it is preferable that the pixel electrode in a planar shape be formed into a substantially rectangular shape, and a contact portion for electrically connecting the pixel electrode to the switching element be disposed in a corner of the pixel electrode in planar view.

In this case, the contact portion for electrically connecting the pixel electrode to the switching element is disposed in a corner of the pixel electrode. When the contact portion is disposed so as to overlap with the second micro lens in planar view, it becomes difficult to form the contact portion, however, when the contact portion is disposed in the corner of the pixel electrode, it is possible to easily dispose the contact portion without overlapping with the second micro lens. Accordingly, it is possible to further suppress a decrease in the use efficiency of light.

APPLICATION EXAMPLE 5

In the substrate for electro-optical apparatus according to the application example, it is preferable that a relay electrode be provided between the contact portion and the switching element, and the relay electrode be disposed on the same layer as the second micro lens or disposed closer to the pixel electrode side than the second micro lens.

In this case, the relay electrode which is provided between the contact portion and the switching element is disposed on the same layer as the second micro lens or disposed closer to the pixel electrode side than the second micro lens. For this reason, in a case where the switching element and the pixel electrode are far from one another and thus it is not easy to directly connect both to each other, the relay electrode is provided in a place closer to the pixel electrode than the second light shielding layer so that both are electrically connected to each other by relaying the relay electrode.

APPLICATION EXAMPLE 6

In the substrate for electro-optical apparatus according to the application example, it is preferable that the relay electrode be disposed in the corner of the pixel electrode in planar view.

In this case, since the relay electrode through which the light is not transmitted is disposed in the corner of the pixel electrode, it is possible to enlarge the second micro lens in a planar shape compared to a case where the relay electrode is disposed in other portions. Accordingly, it is possible to further suppress a decrease in the use efficiency of light.

APPLICATION EXAMPLE 7

In the substrate for electro-optical apparatus according to the application example, it is preferable that the second micro lens be thinner than the first micro lens.

As a thickness of the first micro lens disposed on the first substrate side with respect to the first light shielding layer is thick, the refractive power of the first micro lens can be enhanced. Therefore, it is possible to condense a large amount of the light incident from the first substrate side. On the other hand, as a thickness of the second micro lens disposed on the pixel electrode side with respect to the switching element is thin, the switching element and the pixel electrode become closer to each other. Therefore, it is possible to electrically connect the switching element and the pixel electrode to each other more easily. In this case, since the thickness of the second micro lens is thinner than that of the first micro lens, it is possible to satisfy the aforementioned condition.

APPLICATION EXAMPLE 8

In the substrate for electro-optical apparatus according to the application example, it is preferable that a distance between the second light shielding layer and the second micro lens be smaller than a distance between the first light shielding layer and the first micro lens.

When the distance between the first light shielding layer and the first micro lens is small, it is necessary to enhance the refractive power of the first micro lens and then the thickness of the first micro lens becomes thicker. Therefore, it is preferable that the distance between the first light shielding layer and the first micro lens be not too small. On the other hand, when the distance between the second light shielding layer and the second micro lens is large, the switching element and the pixel electrode become separated from one another and thus are not electrically connected to each other. Therefore, it is preferable that the distance between the second light shielding layer and the second micro lens be small. In this case, since the distance between the second light shielding layer and the second micro lens is smaller than the distance between the first light shielding layer and the first micro lens, it is possible to satisfy the aforementioned condition.

APPLICATION EXAMPLE 9

In the substrate for electro-optical apparatus according to the application example, it is preferable that a diameter of the first micro lens be equal to or larger than that of the second micro lens.

It is preferable that the diameter of the first micro lens be large so as to condense a large amount of the light incident from the first substrate side. In addition, it is preferable that the diameter of the second micro lens be the size capable of ensuring a space for providing the contact portion to connect the switching element and the pixel electrode to each other between the adjacent second micro lenses. In this case, since the diameter of the first micro lens is equal to or larger than the second micro lens, it is possible to satisfy the aforementioned condition.

APPLICATION EXAMPLE 10

In the substrate for electro-optical apparatus according to the application example, the apparatus may further include a second substrate, in which the first micro lens is provided on the first substrate, the first light shielding layer, the switching element, the second light shielding layer, and the second micro lens are disposed on the second substrate, and the first substrate and the second substrate are joined to each other via an adhesive layer which is disposed between the first micro lens and the second substrate.

In a case where the first micro lens is formed on the first substrate at first, and then the switching element is formed thereon, the first substrate is exposed to a high temperature in a process of forming the switching element, therefore, the first micro lens becomes exposed to the high temperature as well. In this case, since the first micro lens is formed on the first substrate and the switching element is formed on the second substrate separately from the first substrate, the first micro lens is not exposed to the high temperature. Therefore, it is possible to use a resin material or a material having a slightly low high-temperature resistance with respect to the first micro lens. In addition, even in a case of using a material having high-temperature resistance, it is possible to avoid a risk of quality degradation such as crack initiation which may occur due to the heating at high temperature or temperature change.

APPLICATION EXAMPLE 11

According to this application example, there is provided a substrate for electro-optical apparatus including: a pixel electrode; a switching element that is provided to correspond to the pixel electrode and includes a semiconductor film having a channel area; a first light shielding layer that is provided on the side opposite to the pixel electrode of the switching element and disposed so as to overlap with the channel area; a second light shielding layer that is provided between the switching element and the pixel electrode and disposed so as to overlap with the channel area in planar view; a first micro lens that is provided on the side opposite to the switching element of the first light shielding layer and disposed so as to overlap with the pixel electrode in planar view; and a second micro lens that is provided be the second light shielding layer and the pixel electrode and disposed so as to overlap with the pixel electrode in planar view.

In this case, the substrate for electro-optical apparatus is configured to have the second micro lens, the second light shielding layer, the switching element, the first light shielding layer, and the first micro lens which are disposed in order on the lower layer of the pixel electrode. For this reason, even in a case where at least a portion of either of the first light shielding layer and the second light shielding layer is divided, the use efficiency of light can be improved by reducing an amount of the light being shielded in the light shielding layer on which the light is incident due to the condensing efficiency of the micro lens on which the light is incident. In addition, for example, in a case where the electro-optical layer is disposed on the pixel electrode side of the substrate for electro-optical apparatus, since the inclination of the optical axis of the light, which is incident on the electro-optical layer from the side opposite to the pixel electrode, with respect to the vertical direction is reduced, and the light incident from the pixel electrode side transmits the electro-optical layer before the substrate for electro-optical apparatus, the phase shift in the electro-optical layer can be reduced to suppress a decrease in transmittance and contrast.

APPLICATION EXAMPLE 12

According to this application example, there is provided an electro-optical apparatus having the substrate for electro-optical apparatus as the element substrate, the apparatus including: an element substrate disposed on the light incident side; a counter substrate that is disposed to face the element substrate and provided with a common electrode on the surface of the element substrate side; and a electro-optical layer that is disposed between the first element substrate and the counter substrate.

In this case, since the aforementioned substrate for electro-optical apparatus is provided as the element substrate, when the light is incident from the element substrate side, the use efficiency of light can be improved by reducing an amount of the light being shielded in the first light shielding layer due to the condensing efficiency of the first micro lens. Then, the optical axis of the condensed light in the first micro lens can be close to the high contrast axis direction in the second micro lens so as to be incident on the electro-optical layer. Further, when the light is incident from the counter substrate side, the use efficiency of light can be improved by reducing an amount of the light being shielded in the second light shielding layer among the light incident from the counter substrate side due to the condensing efficiency of the second micro lens. The light incident on the substrate for electro-optical apparatus from the counter substrate side transmits the electro-optical layer before being condensed in the second micro lens. Therefore, it is possible to provide the electro-optical apparatus capable of improving the use efficiency of the light and the contrast.

APPLICATION EXAMPLE 13

According to this application example, there is provided electronic equipment including the electro-optic device.

In this case, since the electro-optical apparatus capable of improving the use efficiency of the light and the contrast is provided, it is possible to provide electronic equipment capable of projecting a bright image with high contrast on a screen.

BRIEF DESCRIPTION OF THE DRAWINGS

The invention will be described with reference to the accompanying drawings, wherein like numbers reference like elements.

FIG. 9 is a schematic cross-sectional view illustrating a configuration of a liquid crystal device according to a second embodiment.

FIG. 10 is a schematic cross-sectional view illustrating a configuration of a liquid crystal device according to a third embodiment.

DESCRIPTION OF EXEMPLARY EMBODIMENTS

Hereinafter, detailed embodiments of the invention will be described with reference to the accompanying drawings. In order to easily recognize a part to be described, the used drawings are indicated by being appropriately enlarged, contracted, and expanded. In addition, the illustration of the drawings other than constituent elements necessary for explanation may be omitted.

In addition, in the following embodiments, if there is a description, for example, "on the substrate", it means a case of being disposed so as to make contact with an upper surface of the substrate, a case of being disposed on the substrate through other components, and a case of where a certain part is disposed to make contact with the upper surface of the substrate, and the other part is disposed on the substrate through the other components.

First Embodiment

Electro-optical Apparatus

Here, as an electro-optical apparatus, an active matrix type liquid crystal device, which includes a thin film transistor (TFT) as a switching element of a pixel, will be exemplified. The liquid crystal device, for example, can be preferably used as an optical modulator (liquid crystal light valve) of a projection type display device (projector) described later.

Figure 1:
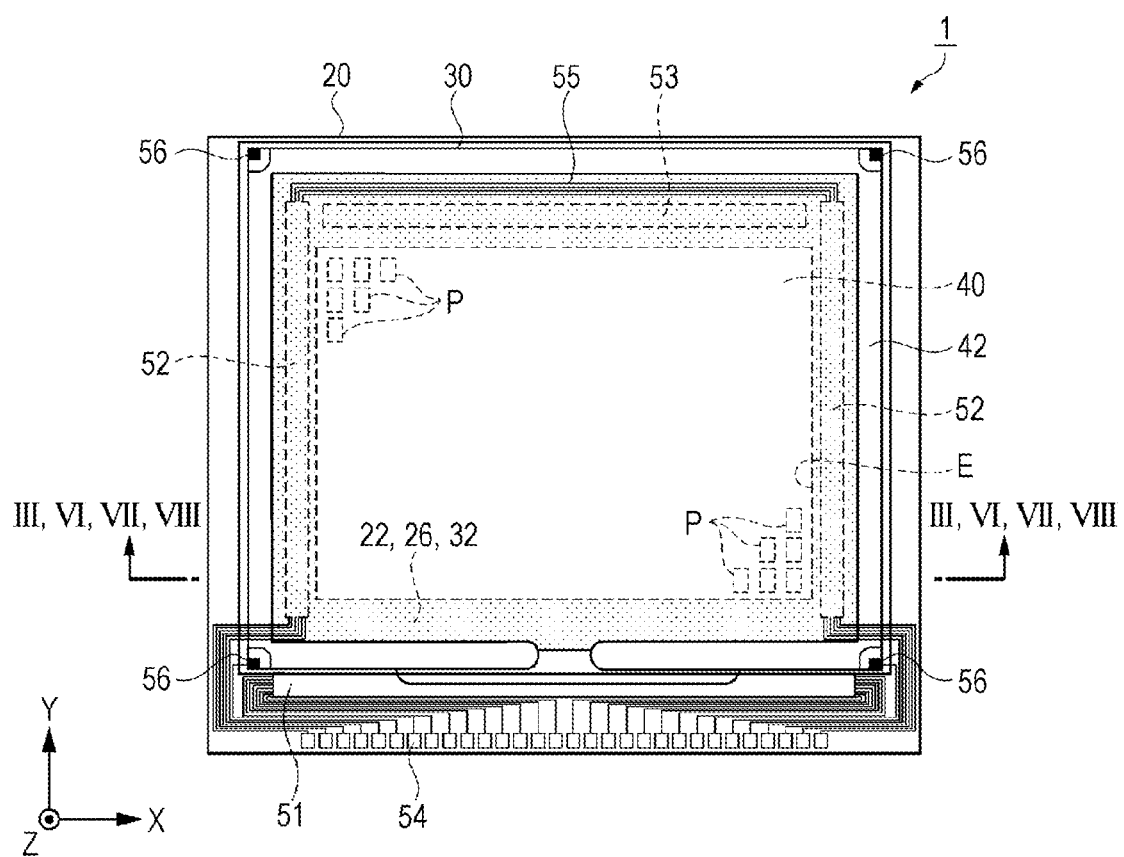
FIG. 1 is a schematic plan view illustrating a configuration of a liquid crystal device according to a first embodiment.
Figure 2:
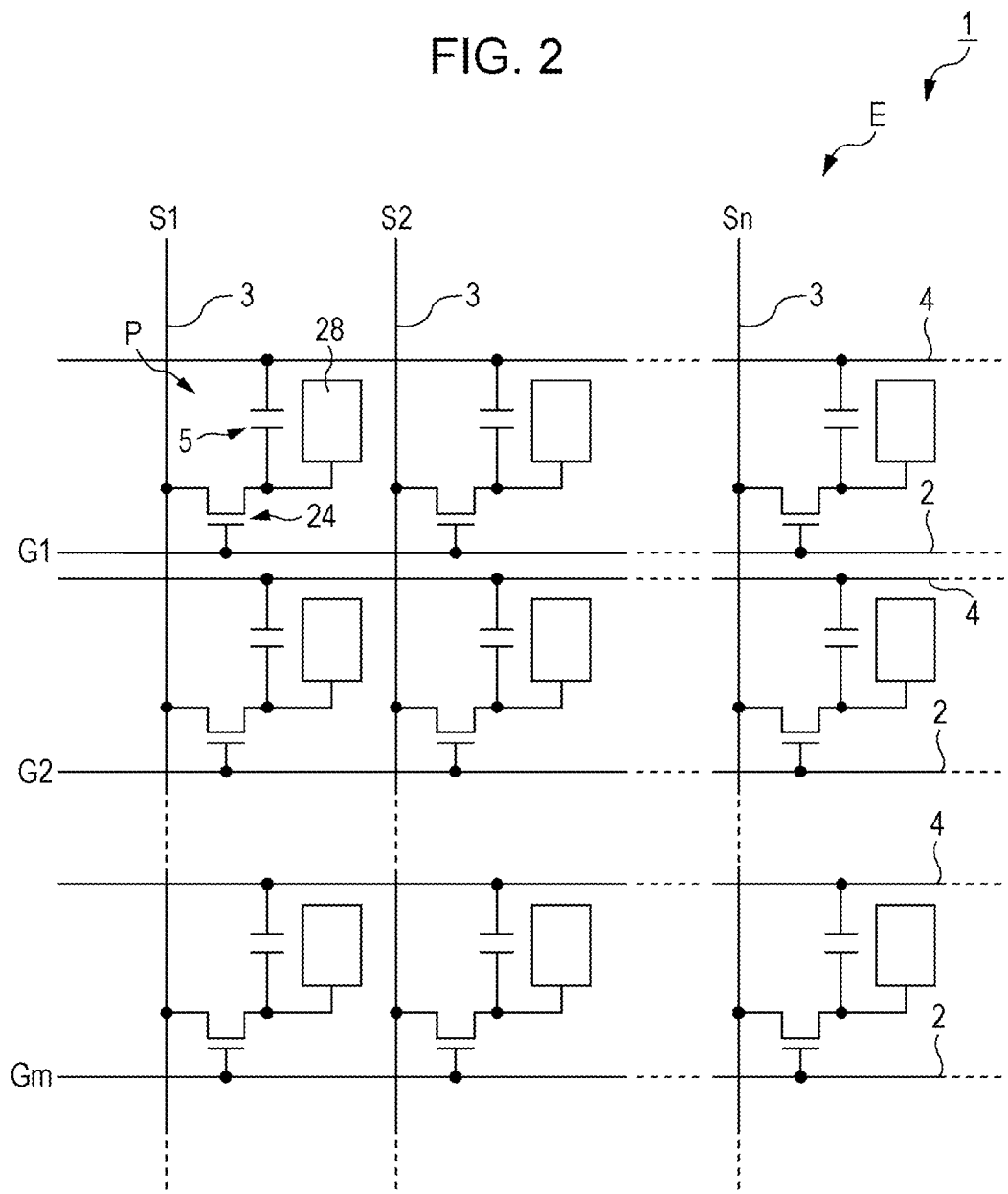
FIG. 2 is an equivalent circuit diagram illustrating an electrical configuration of the liquid crystal device according to the first embodiment.
Figure 3:
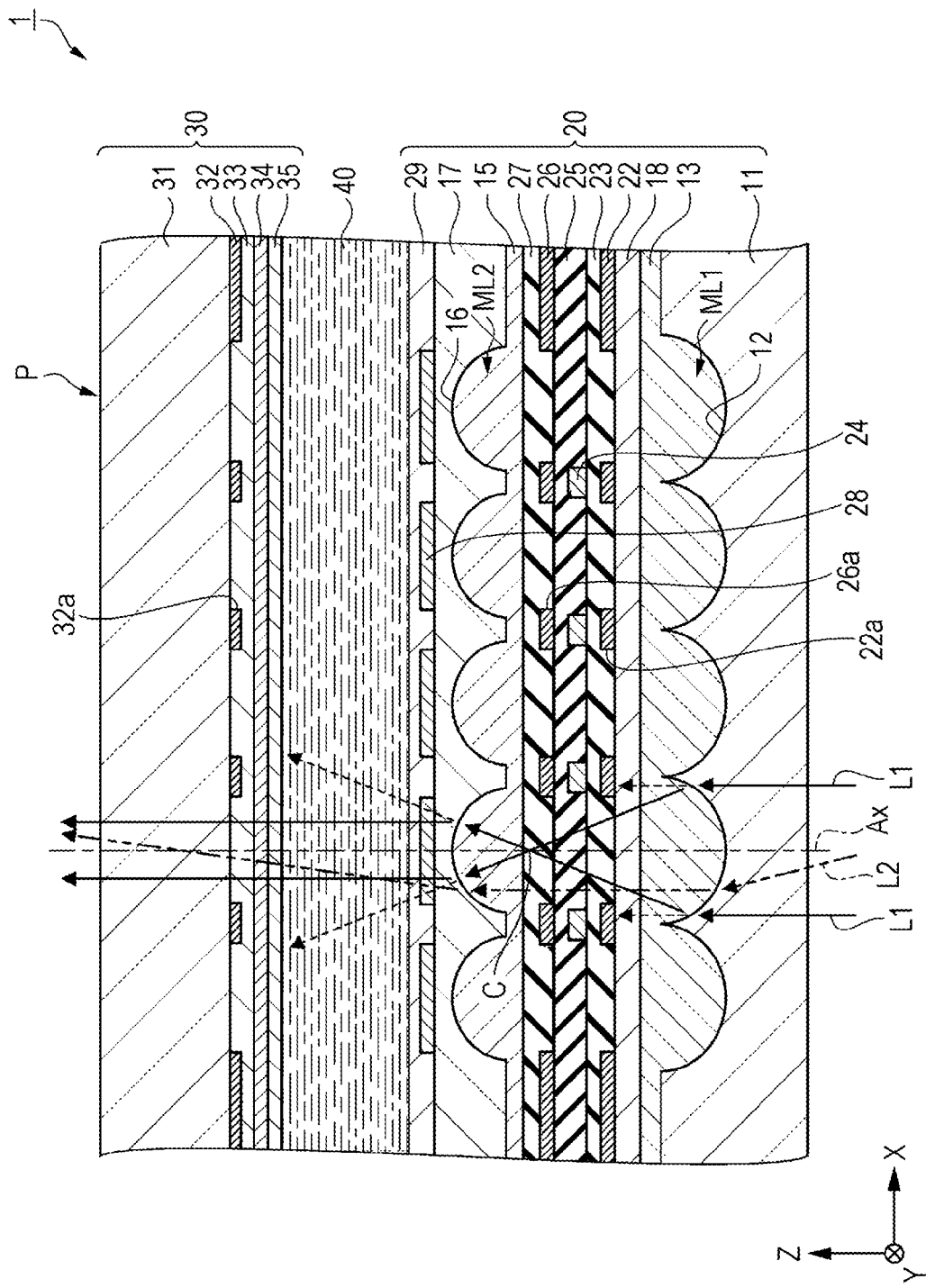
FIG. 3 is a schematic cross-sectional view illustrating a configuration of the liquid crystal device according to the first embodiment.

First, the liquid crystal device as the electro-optical apparatus according to the first embodiment will be described with reference to FIG. 1 to FIG. 3. FIG. 1 is a schematic plan view illustrating a configuration of a liquid crystal device according to a first embodiment. FIG. 2 is an equivalent circuit diagram illustrating an electrical configuration of the liquid crystal device according to the first embodiment. FIG. 3 is a schematic cross-sectional view illustrating a configuration of the liquid crystal device according to the first embodiment. For details, FIG. 3 is a schematic cross-sectional view taken along the line III-III in FIG. 1.

As shown in FIGS. 1 to 3, the liquid crystal device 1 as the electro-optical apparatus according to the first embodiment includes an element substrate 20 as a substrate for electro-optical apparatus, a counter substrate 30 which is disposed to face the element substrate 20, and a liquid crystal layer 40, as an electro-optical layer, which is disposed between the element substrate 20 and the counter substrate 30. As shown in FIG. 1, the element substrate 20 is larger than the counter substrate 30 and both are joined to each other through a seal material 42 which is formed of frame shape and disposed along an edge portion of the counter substrate 30.

The liquid crystal layer 40 is sealed in a space surrounded by the counter substrate 30, the element substrate 20, and the seal material 42. The seal material 42 is formed of an adhesive such as thermosetting or ultraviolet curable epoxy resin. In order to keep a constant clearance between the element substrate 20 and the counter substrate 30, a spacer (not shown) is mixed into the seal material 42.

A light shielding layer 22 as a first light shielding layer and a light shielding layer 26 as a second light shielding layer, which have a peripheral edge part in a frame shape, are provided inside the seal material 42 disposed in the frame shape. The light shielding layers 22 and 26 are formed of, for example, a metal or a metallic oxide which has a light shielding property. A display area E in which a plurality of pixels P is arranged is located inside the light shielding layers 22 and 26. The pixel P is formed into a substantially rectangular shape and arranged in a matrix.

The display area E is an area which substantially contributes to display of an image on the liquid crystal device 1. The light shielding layers 22 and 26 are, for example, formed into a lattice shape so as to partition the plurality of pixels P along a plane. Meanwhile, the liquid crystal device 1 may include a dummy area which is provided so as to surround the display area E and does not substantially contribute to display of an image.

A data line driving circuit 51 and a plurality of external connecting terminals 54, which are along a first side of the element substrate 20, are provided on the side opposite to the display area E in the seal material 42 which is formed along the first side. In addition, an inspection circuit 53 is provided on the display area E side in the seal material 42 which is formed along a second side facing the first side. Further, a scanning line driving circuit 52 is provided inside the seal material 42 which is formed along the other second side perpendicularly facing the second side to each other.

A plurality of wires 55 for connecting two scanning line driving circuits 52 are provided on the display area E side in the seal material 42 on the second side in which the inspection circuit 53 is provided. The wires for connecting these data line driving circuit 51 and scanning line driving circuit 52 are connected to a plurality of external connecting terminals 54. In addition, a vertical conduction part 56 is provided on the corner of the counter substrate 30 so as to electrically connect the element substrate 20 and the counter substrate 30. Meanwhile, the disposition of the inspection circuit 53 is not limited and may be provided in a position along the inside of the seal material 42 between the data line driving circuit 51 and the display area E.

In the following description, a direction along the first side on which the data line driving circuit 51 is provided is set to be X direction, and a direction along the other second side perpendicularly facing the first side to each other is set to be Y direction. The X direction is a direction taken along the line I-I in FIG. 1. A direction which is perpendicular to the X direction and the Y direction and faces upward is set to be Z direction in FIG. 1. Note that in the specification, the viewing of the liquid crystal device 1 from a normal direction (Z direction) of the outer surface of the counter substrate 30 is referred to as "planar view".

As shown in FIG. 2, in the display area E, a scanning line 2 and the data line 3 are formed to be intersected with each other and the pixel 9 is provided corresponding to the intersection between the scanning line 2 and the data line 3. A pixel electrode 28 and a TFT 24 as a switching element are provided in each pixel P.

A source electrode 43 of the TFT 24 (refer to FIG. 5) is electrically connected to the data line 3 extended from the data line driving circuit 51 (refer to FIG. 1). Image signals (data signal) S1, S2, . . . , Sn from the data line driving circuit 51 are sequentially supplied to the data line 3. A gate electrode 24g of the TFT 24 (refer to FIG. 5) is a part of the scanning line 2 extended from the scanning line driving circuit 52. Scanning signals G1, G2, . . . , Gm from the scanning line driving circuit 52 is sequentially supplied to the scanning line 2. A drain electrode 44 of the TFT 24 (refer to FIG. 5) is electrically connected to the pixel electrode 28.

In a state where the TFT 24 is turned on during a certain period of time, the image signals S1, S2, . . . , Sn are written into the pixel electrode 28 through the data line 3 at a predetermined timing. In this way, the predetermined level of image signals written into the liquid crystal layer 40 through the pixel electrode 28 are held for a certain period in a liquid crystal capacitor which is formed between the liquid crystal layer 40 and a common electrode 34 as a second electrode provided on the counter substrate 30 (refer to FIG. 3). A liquid crystal alignment state changes depending on the applied voltage level when a voltage signal is applied to the liquid crystal of the respective pixel electrodes P. Therefore, it is possible to perform a gradation display by modulating the light incident on the liquid crystal layer 40 (refer to FIG. 3).

In order to prevent the held image signals S1, S2, . . . , Sn from being leaked, a storage capacitance 5 is disposed in parallel with the liquid crystal capacitance. A capacity line 4 is formed along the scanning line 2 so as to constitute the storage capacitance 5. The capacity line 4 is connected to a common potential line (COM) and held in a predetermined potential.

The liquid crystal constituting the liquid crystal layer 40 causes the light to be modulated so as to perform the gradation display due to the alignment or order of an assembly being changed depending on the applied voltage level. For example, in a case of a normally white mode, the transmittance with respect to the incident light is decreased according to the voltage applied in a unit of each pixel P. In the normally white mode, the transmittance with respect to the incident light is increased according to the voltage applied in a unit of each pixel P, and the light having contrast according to the image signals is emitted from the liquid crystal device 1 as a whole.

As shown in FIG. 3, the element substrate 20 according to the embodiment includes a substrate 11 as the first substrate, and a micro lens ML1 as a first micro lens and a micro lens ML2 as a second micro lens provided on the substrate 11. Note that in the embodiment, the counter substrate 30 side (+Z direction) and the substrate 11 side (−Z direction) in the liquid crystal device 1 are respectively referred to as "upper side" and "lower side".

The micro lens ML2 is disposed on the liquid crystal layer 40 side upper than the micro lens ML1. The light shielding layer 22, the TFT 24, and the light shielding layer 26 are sequentially disposed between the micro lens ML1 and the micro lens ML2 upward.

The substrate 11 is formed of a material having light permeability such as glass or quartz. In the embodiment, the substrate 11 is formed of silicon oxide ($SiO_2$). A plurality of concavities 12 are provided on the liquid crystal layer 40 side of the substrate 11. The concavity 12 is disposed corresponding to each pixel P.

The concavity 12 is formed into a curved-surface shape to be tapered toward the substrate 11 side opposite to the liquid crystal layer 40. The curved surface of the concavity 12 is, for example, formed into a spherical shape.

A lens layer 13 is formed so as to embed the concavities 12 of the substrate 11. The lens layer 13 is formed of a material having light permeability and an optical refractive index different from the substrate 11. In the embodiment, the lens layer 13 is formed of inorganic materials having the optical refractive index higher than that of the substrate 11. As the inorganic material described above, silicon oxynitride (SiON), alumina ($Al_2O_3$), or borosilicate glass can be exemplified. In the embodiment, the lens layer 13 is formed of the silicon oxynitride (SiON).

The micro lens ML1 which is convex and swelled downward is formed by embedding the concavities 12 of the substrate 11 with the material of the lens layer 13. Since the optical refractive index of the lens layer 13 is higher than that of the substrate 11, the micro lens ML1 has positive refractive power. That is, the light incident from the lower side of the substrate 11 is refracted toward a focus C of the micro lens ML1, which is positioned on the pixel electrode 28 side, in a bonding interface between the substrate 11 and the lens layer 13. A straight line passing through the focus C and the planar center of the micro lens ML1 (concavity 12) is set to be an optical axis Ax of the micro lens ML1. The optical axis Ax of the micro lens ML1 is approximately in parallel with the normal direction (Z direction) of the substrate 11.

A planarization process is executed on the top surface of the lens layer 13. An optical path length-adjusting layer 18 is provided on the lens layer 13 so as to cover the lens layer 13. The optical path length-adjusting layer 18 is formed of inorganic materials having, for example, the almost same optical refractive index as that of the substrate 11. The optical path length-adjusting layer 18 has a function of adjusting the focus C of the micro lens ML1 to fit in the desired position. In the embodiment, the focus C of the micro lens ML1 is positioned on a curved surface of convex portion 16 of the micro lens ML2 or on the substrate 11 side lower than the curved surface.

The light shielding layer 22 is provided on the optical path length-adjusting layer 18. The light shielding layer 22 is formed of a material having the light shielding property such as molybdenum (Mo), tungsten (W), titanium (Ti), titanium nitride (TiN), and chrome (Cr). The light shielding layer 22 is formed into a lattice shape and has an opening 22a. The inside of the opening 22a becomes an area through which the light passes. The light shielding layer 22 partitions the area of the pixel P. That is, the opening 22a of the light shielding layer 22 is the area of the pixel P through which the light passes. Meanwhile, the light shielding layer 22 may be formed of a plurality of light shielding films and formed into the grid shape so as to be complementary to each other.

The opening 22a of the light shielding layer 22 is disposed so as to overlap with the micro lens ML1 (concavity 12) in planar view. The planar center of the opening 22a approximately matches with the planar center of the micro lens ML1 (concavity 12) in planar view. Accordingly, the optical axis Ax of the micro lens ML1 passes the planar center of the opening 22a or the vicinity therein.

An insulating layer 23 is provided to cover the optical path length-adjusting layer 18 and light shielding layer 22. The insulating layer 23 is formed of inorganic materials such as $SiO_2$. The TFT 24 is provided on the insulating layer 23. The TFT 24 is the switching element which drives the pixel electrode 28. The TFT 24 is provided with a semiconductor layer 24a having a channel area 24c (refer to FIG. 5). The TFT 24 is disposed so that the channel area 24c of the semiconductor layer 24a overlaps with the light shielding layer 22. Note that a configuration of the TFT 24 and a configuration of electrically connecting the TFT 24 and the pixel electrode 28 will be described later.

An insulating layer 25 is provided so as to embed the insulating layer 23 and the TFT 24. A light shielding layer 26 is provided on the insulating layer 25. The light shielding layer 26 is disposed so as to overlap with the light shielding layer 22. The light shielding layer 26 has an opening 26a which is provided so as to overlap with the opening 22a of light shielding layer 22 in planar view. The light shielding layer 22 and the light shielding layer 26 are disposed to have the channel area 24c of the TFT 24 interposed therebetween in a thickness direction (Z direction) of the element substrate 20. An insulating layer 27, which is formed of inorganic materials such as $SiO_2$, is provided so as to embed the insulating layer 25 and the light shielding layer 26.

A lens layer 15 is provided on the insulating layer 27. The lens layer 15 is formed of an inorganic material having light permeability such as SiON. The lens layer 15 has the convex portions 16 which are swelled in a curved surface shape upward. The curved surface of the convex portion 16 is, for example, formed into a substantially spherical shape.

The micro lens ML2 is configured to have the convex portion 16 in the lens layer 15. The micro lens ML2 (convex portion 16) is disposed so as to overlap with the micro lens ML1 (concavity 12), the opening 22a of the light shielding layer 22, and the opening 26a of the light shielding layer 26 in planar view. The planar center of the micro lens ML2 (convex portion 16) approximately matches with the planar center of the micro lens ML1 (concavity 12) in planar view.

A light-transmitting layer 17 is provided to embed the space between convex portions 16 by covering the lens layer 15. The light-transmitting layer 17 is formed of an inorganic material such as $SiO_2$ having light permeability and the lower optical refractive index than the lens layer 15. A planarization process is executed on the top surface of the light-transmitting layer 17.

Since the optical refractive index of the light-transmitting layer 17 is lower than that of the lens layer 15, the micro lens ML2 has the positive refractive power. That is, the light incident from the micro lens ML1 is refracted toward a focus (not shown) of the micro lens ML2, which is positioned on the pixel electrode 28 side, in a joint interface between the lens layer 15 and the light-transmitting layer 17. An optical axis of the micro lens ML2 approximately matches with optical axis Ax of the micro lens ML1. Accordingly, the focus of the micro lens ML2 is disposed on a line extended from the optical axis Ax of the micro lens ML1 or in the vicinity thereof.

The pixel electrode 28 is provided on the light-transmitting layer 17 so as to correspond to the pixel P. The pixel electrode 28 is disposed on an area overlapping with the micro lens ML1 (concavity 12), the opening 22a of the light shielding layer 22, the opening 26a of the light shielding layer 26, and the micro lens ML2 (convex portion 16) in planar view. The pixel electrode 28 is formed of a transparent conductive film such as indium tin oxide (ITO) or indium zinc oxide (IZO). The pixel electrode 28 is electrically connected to the TFT 24. An oriented film 29 is provided to cover the light-transmitting layer 17 and the pixel electrode 28.

The counter substrate 30 is provided with a substrate 31, a light shielding layer 32, a protecting layer 33, a common electrode 34, and an oriented film 35. The substrate 31 is formed of a material having light permeability such as glass or quartz. The light shielding layer 32 is formed into a lattice shape so as to overlap with the light shielding layer 22 of the element substrate 20 and the light shielding layer 26 in planar view. The light shielding layer 32 has an opening 32a which is provided to overlap with the opening 22a of the light shielding layer 22 and the opening 26a of the light shielding layer 26 in planar view.

The protecting layer 33 is provided to cover the substrate 31 and light shielding layer 32. The common electrode 34 is provided to cover the protecting layer 33. The common electrode 34 is formed to extend over a plurality of pixels P. The common electrode 34 is formed of a transparent conductive film such as indium tin oxide (ITO) or indium zinc oxide (IZO). The oriented film 35 is provided to cover the common electrode 34.

The liquid crystal layer 40 is sealed in a space between the oriented film 29 on the element substrate 20 side and the oriented film 35 on the counter substrate 30 side. The liquid crystal device 1 in the embodiment is a so called vertical alignment (VA) mode liquid crystal device. More specifically, in a state where an electric field is not applied between the common electrode 34 and the pixel electrode 28 (state in the absence of electric field application), the liquid crystal layer 40 becomes the vertical alignment mode in which liquid crystal molecules are arranged approximately parallel to the normal direction (Z direction) of the substrate 11.

Meanwhile, the protecting layer 33 is provided only to cover the light shielding layer 32 so as to make a surface, facing the liquid crystal layer 40, of the common electrode 34 be flat, thus is not the essential constituent element, and thereby the common electrode 34 may be replaced with the protecting layer 33 so as to directly cover the conductive light shielding layer 32, for example.

In the liquid crystal device 1 according to the first embodiment, the light emitted from a light source or the like is incident from the element substrate 20 side (substrate 11) including the micro lenses ML1 and ML2. Among the light incident on the micro lens ML1 from the substrate 11 side, the light (not shown) incident on the planar center of the micro lens ML1 along the optical axis Ax of the micro lens ML1 is emitted to the side of counter substrate 30 side by passing through the liquid crystal layer 40 along the optical axis Ax.

On the outside further than the planar center of the micro lens ML1, if the light L1, which is incident on the peripheral edge part of the micro lens ML1 from the area overlapping with the light shielding layer 22 in planar view, goes straight, the light L1 is shielded by the light shielding layer 22 as shown by a dashed line and thus is refracted to the planar center side of the opening 22a of the light shielding layer 22 toward the focus C by the micro lens ML1. In addition, similarly, if light L2, which is obliquely incident on the micro lens ML1 from the area overlapping with the opening 22a of the light shielding layer 22 in planar view, goes straight, the light L2 is also shielded by the light shielding layer 22, and thus is refracted to the planar center side of the opening 22a of the light shielding layer 22.

In the liquid crystal device 1, the light L1 and the light L2 which are shielded by the light shielding layer 22 in a case of going straight as above described can pass through the liquid crystal layer 40 by being incident into the opening 22a of the light shielding layer 22 due to a condensing action of the micro lens ML1. Consequently, the amount of light which is emitted from the counter substrate 30 side can be increased, thereby improving the use efficiency of light.

The light L1 condensed by the micro lens ML1 is incident on the micro lens ML2 so as to radially spread by intersecting with optical axis Ax at the focus C, but if the light L1 goes straight, the light L1 is inclined in the oblique direction with respect to the optical axis Ax of the micro lens ML1 and thus the liquid crystal layer 40 advances in the oblique direction with respect to a alignment direction of liquid crystal molecules as shown in a dashed line, thereby generating the phase shift in the liquid crystal layer 40. As a result, a decrease in transmittance of the light transmitted through the liquid crystal layer 40 causes a reduction in contrast of the liquid crystal device 1. Further, when the inclination of the light L1 with respect to the optical axis Ax is large, the light L1 is shielded by the light shielding layer 32 or incident on the opening 32a, adjacent to the light shielding layer 32, of the pixel P.

In the liquid crystal device 1, the light L1, which is condensed in the micro lens ML1 and inclined with respect to the optical axis Ax, is refracted to the optical axis Ax side of the micro lens ML1, that is, the planar center side of the opening 32a of the light shielding layer 32 toward the focus in the micro lens ML2. This refraction causes an angle of inclination of the light L1 with respect to a alignment direction of the liquid crystal molecules to be smaller, and thus the phase shift in the liquid crystal layer 40 is decreased to suppress the decrease in transmittance of the light transmitted through the liquid crystal layer 40, thereby improving the contrast of the liquid crystal device 1. Therefore, according to a configuration of element substrate 20 provided in the electro-optical apparatus 1, it is possible to improve the use efficiency of the light and the contrast.

When the light L1 is refracted to the planar center side of the opening 32a of the light shielding layer 32, it is possible to suppress that the light L1 is shielded by the light shielding layer 32 or incident on the opening 32a, adjacent to the light shielding layer 32, of the pixel P. Further, since the inclination of the optical axis of the light emitted from the counter substrate 30 with respect to the vertical direction can be made small, it is possible to suppress the vignetting of the projection lens when the liquid crystal device 1 is used as a liquid crystal light valve of a projector.

Meanwhile, the above description assumes that the light is incident from the element substrate 20 side; however, the liquid crystal device 1 according to the embodiment can be used by causing the light to be incident from the counter substrate 30 side. In a case where the light is incident from the counter substrate 30 side, the light passes through the liquid crystal layer 40 in a state of being emitted from the light source so as to be incident on the micro lens ML2 from the pixel electrode 28 side. Namely, since the light incident on the liquid crystal device 1 from the counter substrate 30 side is incident on the element substrate 20 and passes through the liquid crystal layer 40 before condensing the light in the micro lens ML2, the phase shift in the liquid crystal layer 40 can be reduced to suppress a decrease in transmittance and contrast.

The light incident on the element substrate 20 passes through the opening 26a of the light shielding layer 26 by being refracted in the micro lens ML2 and then is emitted to the substrate 11 side by being refracted again in the micro lens ML1. Accordingly, the use efficiency of light can be improved by reducing the amount of the light being shielded in the light shielding layer 26 due to condensing efficiency of the micro lens ML2 and it is possible to suppress the vignetting of the projection lens by reducing the inclination of an optical axis of the light with respect to a vertical direction in the micro lens Ml.

Here, it is desirable that the distance between the micro lens ML1 and the micro lens ML2 is properly set according to the position of focus of each micro lens so that the light which is refracted in the micro lens ML 1 and the micro lens ML2 is not incident on the adjacent pixel P.

It is preferable that a diameter of the micro lens ML1 (concavity 12) be larger than that of the opening 22a of the light shielding layer 22. As the diameter of the micro lens ML1 is large, it is possible to condense much more amount of the light incident from the substrate 11 side so as to pass the inside of the opening 22a. Therefore, the adjacent micro lenses ML1 (concavity 12) may be provided by coming close to each other.

On the other hand, it is preferable that a diameter of the micro lens ML2 (convex portion 16) be equal to or smaller than that of the micro lens ML1 (concavity 12). More specifically, it is preferable that the diameter of the micro lens ML2 (convex portion 16) be slightly larger than the opening 26a of the light shielding layer 26 and the distance between adjacent micro lenses ML2 be separated from one another. When the adjacent micro lenses ML2 are separated from one another, it is possible to provide a space for disposing a relay electrode 46 described later.

Figure 4:
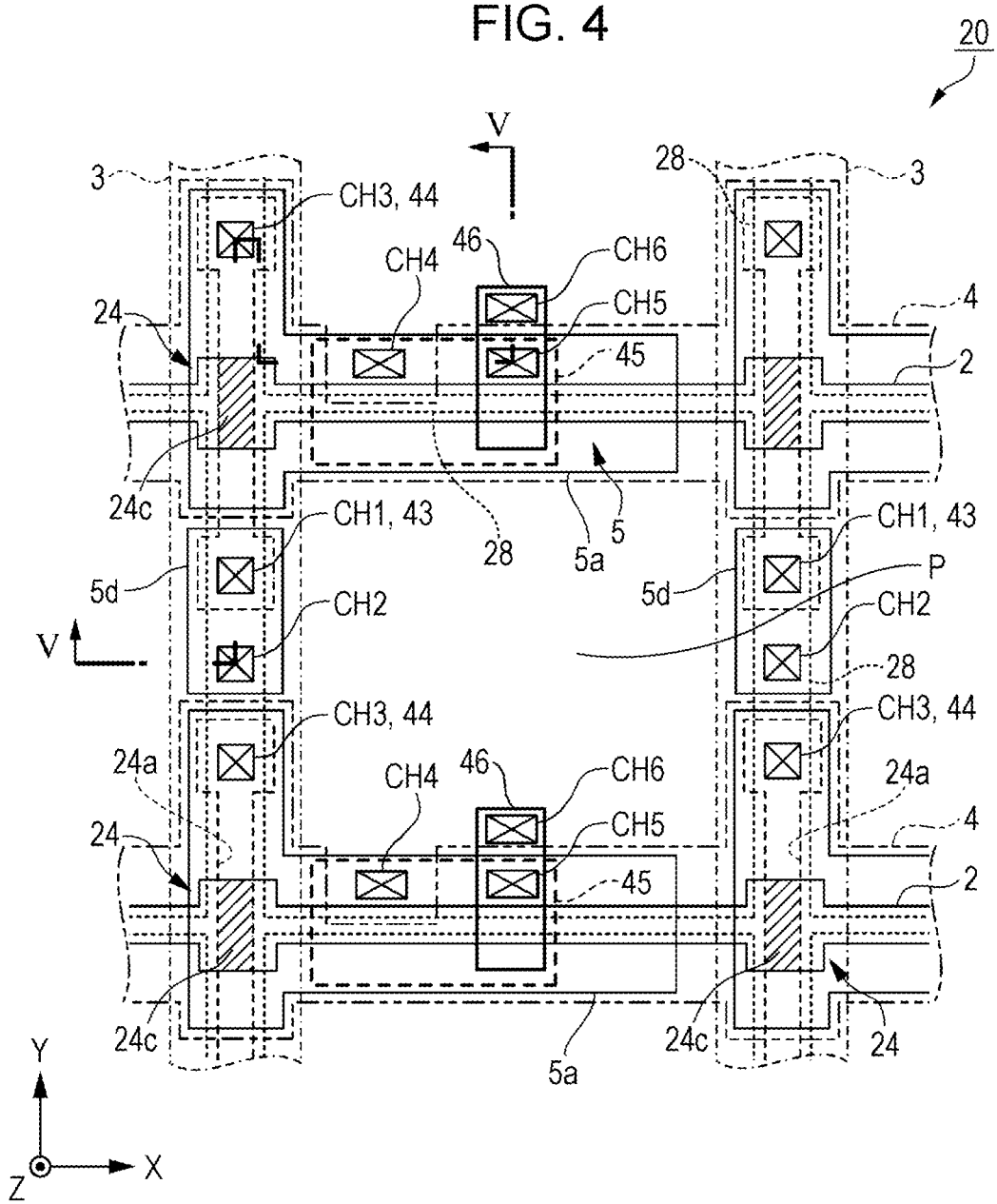
FIG. 4 is a schematic plan view illustrating a configuration of an element substrate according to the first embodiment.
Figure 5:
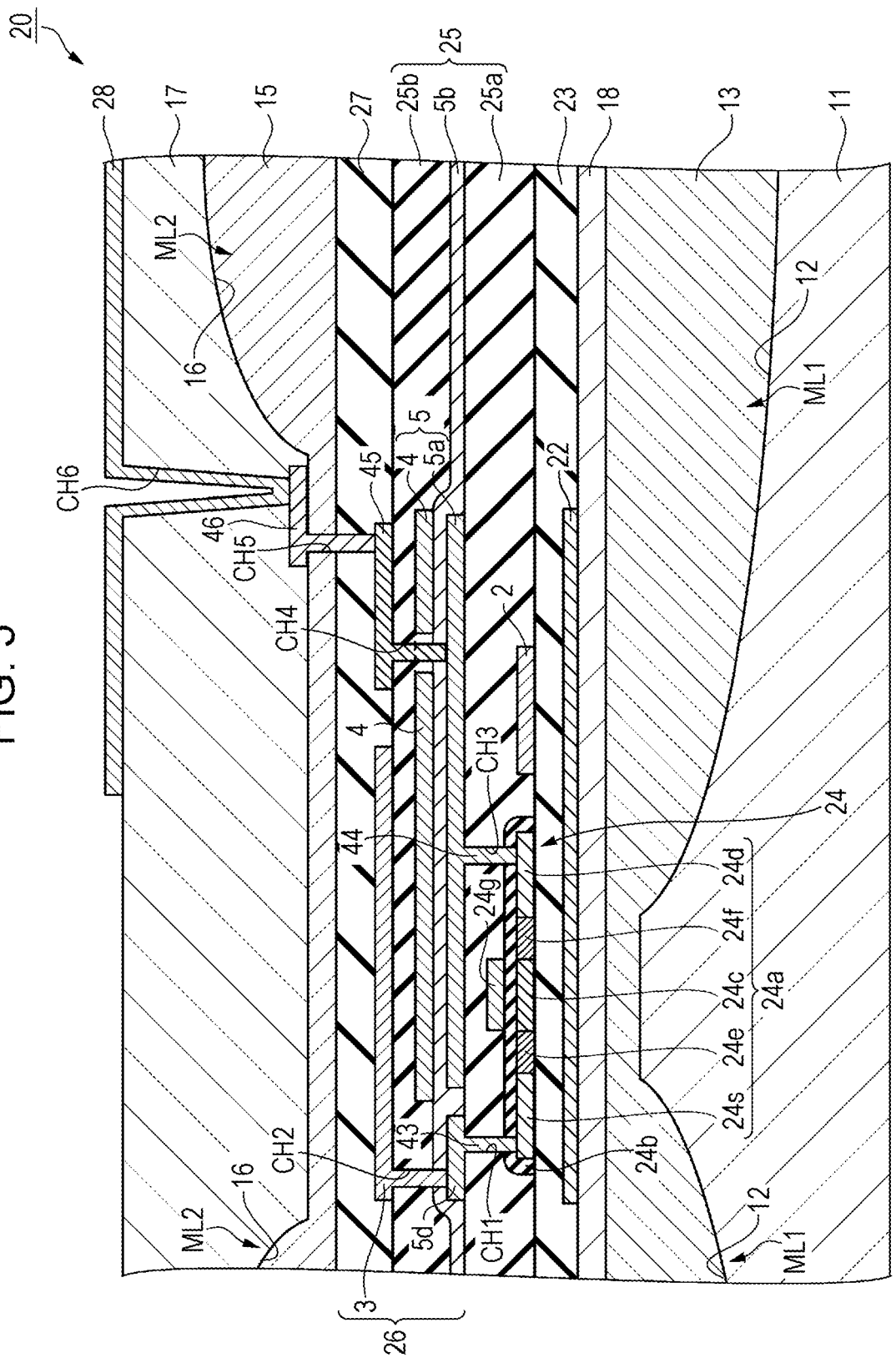
FIG. 5 is a schematic cross-sectional view illustrating a configuration of the element substrate according to the first embodiment.

Meanwhile, when the liquid crystal device 1 includes the dummy area which is provided so as to surround the display area E (refer to FIG. 1), the micro lens ML1 and the micro lens ML2 may be provided in the dummy area. Substrate for electro-optical apparatus Next, the element substrate 20 as the substrate for electro-optical apparatus according to the first embodiment will be described with reference to FIGS. 4 and 5. FIG. 4 is a schematic plan view illustrating a configuration of an element substrate according to the first embodiment. FIG. 4 illustrates constituent elements necessary for describing a configuration of the TFT 24 and a configuration of electrically connecting the TFT 24 and the pixel electrode 28, and a part of the constituent elements is not described. FIG. 5 is a schematic cross-sectional view illustrating a configuration of the element substrate according to the first embodiment. For details, FIG. 5 is a schematic cross-sectional view taken along the line V-V in FIG. 4.

As shown in FIG. 4, the element substrate 20 is provided with the pixel electrode 28 in a substantially rectangular shape for each pixel P. The data line 3 is substantially linearly provided along a boundary between adjacent pixels P in the X direction. The scanning line 2 is substantially linearly provided along a boundary between adjacent pixels P in the Y direction. The TFT 24 is disposed in an area where the data line 3 and the scanning line 2 are intersected with each other.

The element substrate 20 is provided with the capacity line 4 so as to overlap with the scanning line 2 in planar view. The capacity line 4 has a main line part which substantially linearly extends along the scanning line 2 and a sub line part, which substantially linearly extends along the data line 3, in a part where the data line 3 and the scanning line 2 are intersected with each other. In addition, a lower capacity electrode 5a is provided so as to overlap with the capacity line 4 in planar view.

As shown in FIG. 5, the lens layer 13, the optical path length-adjusting layer 18, the light shielding layer 22 and the insulating layer 23 are provided on the substrate 11 having the concavity 12 (micro lens ML1). The light shielding layer 22 is disposed so as to overlap with the semiconductor layer 24a of the TFT 24 in planar view.

The TFT 24 is provided on the insulating layer 23. The TFT 24 includes the semiconductor layer 24a, a gate insulating film 24b, and the gate electrode 24g. The TFT 24 has a lightly doped drain (LDD) structure. The semiconductor layer 24a is, for example, formed of a single crystal silicon film or a polycrystal silicon film. The semiconductor layer 24a is configured to have a channel area 24c, a low-concentration source area 24e, a low-concentration drain area 24f, a high-concentration source area 24s, and a high-concentration drain area 24d.

The gate insulating film 24b is provided so as to cover the semiconductor layer 24a. The gate electrode 24g is disposed so as to face the channel area 24c via the gate insulating film 24b. The gate electrode 24g is a part of the scanning line 2. An interlayer insulating layer 25a is provided to cover the insulating layer 23, the gate insulating film 24b, the gate electrode 24g, and the scanning line 2. A relay electrode 5d and the lower capacity electrode 5a are provided on the interlayer insulating layer 25a.

The relay electrode 5d is disposed so that at least a part thereof overlaps with an end portion on the high-concentration source area 24s side of the semiconductor layer 24a in planar view. In addition, a contact hole CH1 which penetrates the interlayer insulating layer 25a and the gate insulating film 24b is provided so as to overlap with the end portion on the relay electrode 5d and the high-concentration source area 24s side of the semiconductor layer 24a in planar view. The relay electrode 5d is electrically connected to the high-concentration source area 24s of the semiconductor layer 24a via the contact hole CH1, and the part including the contact hole CH1 becomes the source electrode 43.

The lower capacity electrode 5a is disposed so that a part thereof overlaps with the end portion on the high-concentration drain area 24d side of the semiconductor layer 24a in planar view. In addition, a contact hole CH3 which penetrates the interlayer insulating layer 25a and the gate insulating film 24b is provided so as to overlap with the end portion on the lower capacity electrode 5a and the high-concentration drain area 24d side in planar view. The lower capacity electrode 5a is electrically connected to the high-concentration drain area 24d of the semiconductor layer 24a via the contact hole CH3, and the part including the contact hole CH3 becomes the drain electrode 44.

A dielectric film 5b is provided so as to cover the interlayer insulating layer 25a, the relay electrode 5d, and the lower capacity electrode 5a. The capacity line 4 is provided on the dielectric film 5b so as to overlap with the lower capacity electrode 5a in planar view. The storage capacitance 5 is configured to have the capacity line 4, the dielectric film 5b, and the lower capacity electrode 5a. The interlayer insulating layer 25b is provided so as to cover the dielectric film 5b and the capacity line 4. The interlayer insulating layer 25a, the dielectric film 5b, and the interlayer insulating layer 25b correspond to the insulating layer 25 shown in FIG. 3. The data line 3 and a relay electrode 45 are provided on the interlayer insulating layer 25b.

The data line 3 is disposed so that at least a part thereof overlaps with the relay electrode 5d in planar view. In addition, a contact hole CH2 which penetrates the interlayer insulating layer 25b and the dielectric film 5b is provided so as to overlap with the data line 3 and the relay electrode 5d in planar view. Each of the data lines 3 is electrically connected to the relay electrode 5d and the high-concentration source area 24s through the contact holes CH2 and CH1, respectively. Meanwhile, the data line 3, the capacity line 4, and the lower capacity electrode 5a serve as the light shielding layer 26 as shown in FIG. 3.

The relay electrode 45 is disposed so that at least a part thereof overlaps with the lower capacity electrode 5a in planar view. In addition, a contact hole CH4 which penetrates the interlayer insulating layer 25b and the dielectric film 5b is provided so as to overlap with the relay electrode 45 and the lower capacity electrode 5a in planar view. Each of the relay electrodes 45 is electrically connected to the lower capacity electrode 5a and the high-concentration drain area 24d through the contact holes CH4 and CH3, respectively. An insulating layer 27 is provided so as to cover the data line 3 and the relay electrode 45.

The insulating layer 27 is provided with the lens layer 15 having the convex portions 16 (micro lens ML2). On the lens layer 15, the relay electrode 46 is provided between convex portions 16 which are formed separately from one another. The relay electrode 46 is disposed so that at least a part thereof overlaps with the relay electrode 45 in planar view. In addition, the contact hole CH5 which penetrates the lens layer 15 and the insulating layer 27 is provided so as to overlap with the relay electrode 46 and the relay electrode 45 in planar view. The relay electrode 46 is electrically connected to the relay electrode 45 via the contact hole CH5.

The pixel electrode 28 is provided on the light-transmitting layer 17 so as to cover the lens layer 15. The pixel electrode 28 is disposed so that at least a part thereof overlaps with the relay electrode 46 in planar view. In addition, a contact hole CH6 which penetrates the light-transmitting layer 17 is provided as the contact portion so as to overlap with the pixel electrode 28 and the relay electrode 46 in planar view. Each of the pixel electrodes 28 is electrically connected to the relay electrode 46 through the contact hole CH6, and is electrically connected to the high-concentration drain area 24d through the contact hole CH5, the relay electrode 45, the contact hole CH4, the lower capacity electrode 5a, and contact hole CH3.

In the element substrate 20 according to the embodiment, since the micro lens ML2 is provided between the TFT 24 and the pixel electrode 28, the lens layer 15 and the light-transmitting layer 17 which include the micro lens ML2 (convex portion 16) are disposed between the TFT 24 and the pixel electrode 28. For this reason, even though the pixel electrode 28 is electrically connected to the TFT 24 by using the lower-layer wiring (for example, lower capacity electrode 5a) of the pixel electrode 28, the lower capacity electrode 5a and the pixel electrode 28 are far from each other, and thus it is difficult to directly connect both to each other by using the contact hole or the like.

For this reason, the relay electrode 45 between the lower capacity electrode 5a and the pixel electrode 28, and the relay electrode 46 on the lens layer 15, which is the same layer as the micro lens ML2 (convex portion 16) closer to the pixel electrode 28 side than the relay electrode 45, are provided for the relay, thereby enabling the electrical connection of the pixel electrode 28 and the lower capacity electrode 5a to each other. Meanwhile, in a case where the contact hole electrically connecting the pixel electrode 28 and the lower capacity electrode 5a is easily formable, a configuration including either relay electrode 45 or relay electrode 46 may be adopted. Moreover, in a case where another layer is disposed between the light-transmitting layer 17 and the pixel electrode 28, a configuration providing the relay electrode on the light-transmitting layer 17 may be adopted.

Here, it is preferable that the micro lens ML2 be thinner than the micro lens ML1. That is, it is preferable that the height of the convex portion 16 (the length in the Z direction) provided on the lens layer 15 be lower than the depth of the concavity 12 (the length on the Z direction) provided on the substrate 11. As the thickness of the micro lens ML2 is thick, the distance between the pixel electrode 28 and the relay electrode 46 is far from each other, therefore, it is difficult to perform the electrical connection by the contact hole CH6. Accordingly, it is preferable that the micro lens ML2 be thin. On the other hand, as the micro lens ML1 is thick, the refractive power of the micro lens ML1 can be enhanced so as to condense the more light incident from the substrate 11 side, therefore, the thickness of the micro lens ML1 may be thick.

In addition, it is preferable that the distance between the light shielding layer 26 and the micro lens ML2 be smaller than the distance between the light shielding layer 22 and the micro lens ML1. As the distance between the light shielding layer 26 and the micro lens ML2 is large, the distance between the relay electrode 45 and the relay electrode 46 is far from each other, therefore, it is difficult to perform the electrical connection by the contact hole CH5. Accordingly, it is preferable that the distance between the light shielding layer 26 and the micro lens ML2 be small. On the other hand, as the distance between the light shielding layer 22 and the micro lens ML1 is small, it is necessary to enhance the refractive power of the micro lens ML1 in order for the focus C of the micro lens ML1 to be close to the substrate 11 side. Then, the thickness of the micro lens ML1 becomes thicker. Accordingly, the distance between the light shielding layer 22 and the micro lens ML1 may be large.

Returning to FIG. 4, the area in which the scanning line 2, the data line 3, the capacity line 4, and the lower capacity electrode 5a are disposed becomes a light shielding area to which the light is not transmitted in order to display images on the screen. Further, although not shown in FIG. 4, the light shielding layer 22 is also disposed so as to overlap with the light shielding area in planar view. The area surrounded with the light shielding area becomes the area of the pixel P to which the light is transmitted in order to display images on the screen. Meanwhile, the contact hole CH6 for electrically connecting the pixel electrode 28 to the high-concentration drain area 24d of the TFT 24 is disposed substantially at the center of the one side along the scanning line 2 in the pixel electrode 28, and the pixel electrode 28 and the relay electrode 46 are electrically connected to each other via the contact hole CH6. The area overlapping with the relay electrode 46 in planar view becomes an area to which the light is not transmitted.

Manufacturing Method for Substrate for Electro-optical Apparatus

Next, a manufacturing method for the element substrate 20 according to the first embodiment will be described with reference to FIG. 6A to FIG. 8D. FIG. 6A to FIG. 8D are a schematic cross-sectional view illustrating a manufacturing method of the element substrate according to the first embodiment. For details, FIG. 6A to FIG. 8D are a schematic cross-sectional view taken along the line VI-VI, VII-VII, and VIII-VIII in FIG. 1 respectively.

Although not shown in the FIG. 6A to FIG. 8D, in a process of manufacturing the element substrate 20, the process is executed by using a large-sized substrate (mother substrate) capable of taking multiple pieces of the element substrate 20, and the mother substrate is cut out to be individual pieces at the end, thereby obtaining a plurality of the element substrates 20. Accordingly, the processing is performed in a state of the mother substrate before making individual pieces in each process described below, but here the processing for each element substrate 20 in the mother substrate will be described.

Figure 6A:
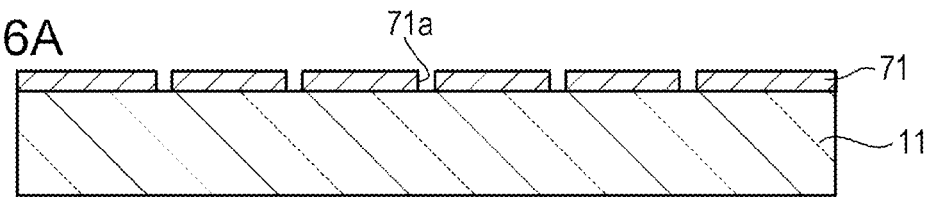
FIGS. 6A to 6E are a schematic cross-sectional view illustrating a manufacturing method of the element substrate according to the first embodiment.

As shown in FIG. 6A, a mask layer 71 is formed of the polycrystal silicon on the top surface of substrate 11 having light permeability such as or quartz. The mask layer 71 can be formed by using, for example, a chemical vapor deposition method (CVD) or a sputtering method. In addition, a plurality of openings 71a is formed on the mask layer 71 to expose the top surface of substrate 11 by a photolithography method. The opening 71a is provided corresponding to the planar center position of the micro lens ML1 (concavity 12) which will be obtained from the subsequent process, that is, the planar center position of the pixel P (refer to FIG. 3).

Figure 6B:
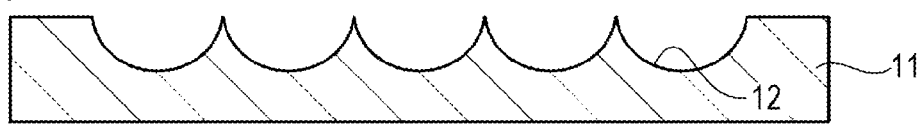

Next, an isotropic etching process such as a wet etching which, for example, uses an etchant such as hydrofluoric acid solution is performed on the substrate 11 through the opening 71a of the mask layer 71. As the aforementioned etching process, the concavity 12 is formed by isotropically etching from the top surface side of the substrate 11 around the opening 71a as the center and then removing the area formed into a substantially hemispherical shape in section view, as shown in FIG. 6B. The concavity 12 is formed into concentric shape around the opening 71a in planar view. In addition, FIG. 6B illustrates a state after removing the mask layer 71.

Figure 6C:
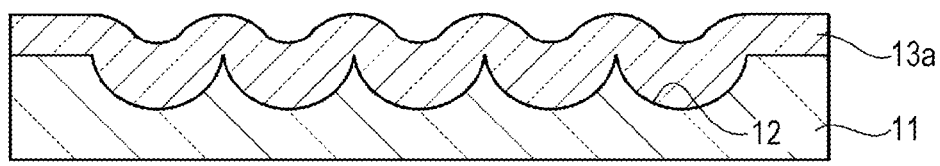

Next, as shown in FIG. 6C, a lens material layer 13a, which is formed of an inorganic material such as SiON having the light permeability and refractive index higher than that of the substrate 11, is formed on the substrate 11 so as to embed the concavity 12. The lens material layer 13a can be formed by using the CVD method or the like. The lens material layer 13a is formed on the substrate 11, on which the concavity 12 is formed, to be accumulated and thus an irregular shape due to the concavity 12 of the upper surface of the substrate 11 is reflected on the top surface of the lens material layer 13a.

Figure 6D:
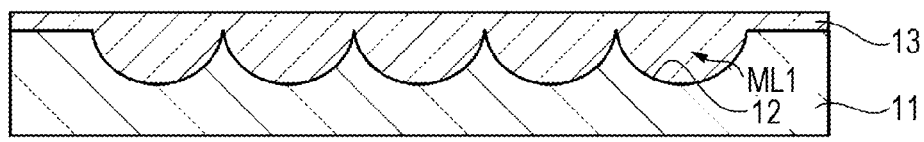

Next, the planarization process is executed on the top surface of the lens material layer 13a. In the planarization process, For example, the top surface of the lens material layer 13a is flattened by being polished, for example, through a chemical mechanical polishing process (CMP) or the like. Meanwhile, as a method for planarization process, it is not limited to the CMP process such as etch-back method may be used. As a result, as shown in FIG. 6D, the lens layer 13 having a top surface planarized is obtained to form the micro lens ML1 of which a shape is convex by the material of the lens layer 13 embedding the concavity 12.

Figure 6E:
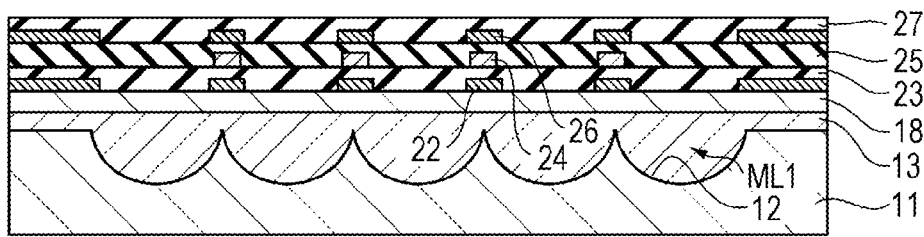

Next, as shown in FIG. 6E, the optical path length-adjusting layer 18 which is formed of an inorganic material such as SiO$_2$ is formed on the lens layer 13 by using a known method. Then, the optical path length-adjusting layer 18 have the light shielding layer 22, the insulating layer 23, the TFT 24, the insulating layer 25, the light shielding layer 26, and the insulating layer 27 which are formed thereon. In addition, electrodes or wirings which include the relay electrode 45 as shown in FIG. 5, and the contact hole including the contact hole CH4 which are formed between the insulating layer 23 and the insulating layer 27. A planarization process is executed on the top surface of the planarized insulating layer 27.

Figure 7A:
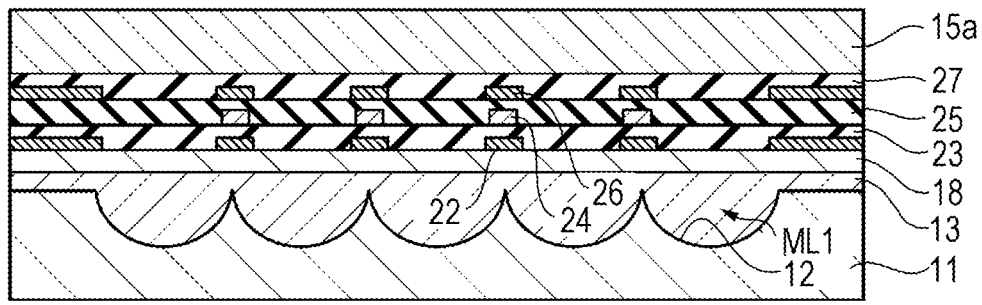
FIGS. 7A to 7D are a schematic cross-sectional view illustrating a manufacturing method of the element substrate according to the first embodiment.

Next, as shown in FIG. 7A, a lens material layer 15a which is formed of an inorganic material such as SiON is formed on the insulating layer 27. The lens material layer 15a can be formed by using the CVD method or the like.

Figure 7B:
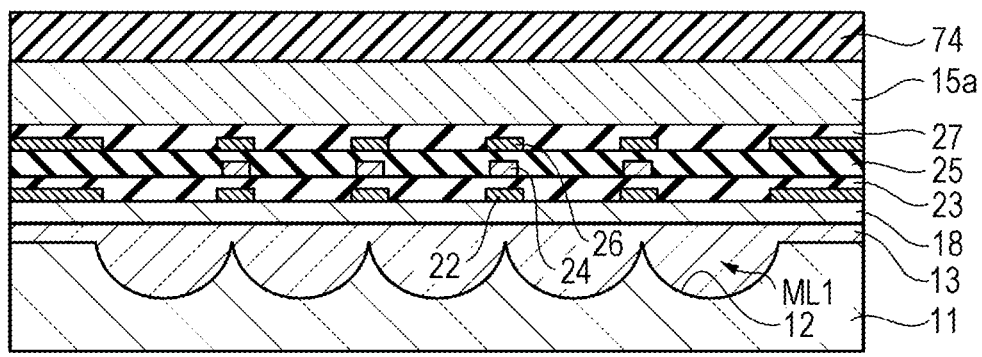

Next, as shown in FIG. 7B, a resist layer 74 is formed on the lens material layer 15a. The resist layer 74 is formed of, for example, a positive light-sensitive resist in which an exposure portion is removed by development. The resist layer 74 can be formed by using a spin coat method, a roll coat method or the like.

Figure 7C:
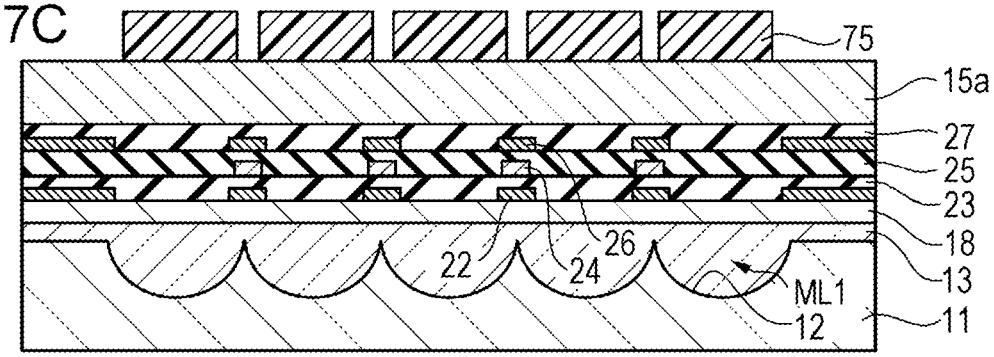

Next, although not shown in FIG. 7C, the resist layer 74 is exposed to be developed through the mask in which the light shielding portion is provided corresponding to the position of the convex portion 16. Accordingly, in the resist layer 74, the area other than the area overlapping with the light shielding portion of the mask is exposed and removed, and portions 75 corresponding to the position of the convex portion 16 remain behind, as shown in FIG. 7C. That is, the residual portions 75 are formed separately from one another. The planar shape of the portion 75, for example, is a substantially rectangular shape.

Figure 7D:
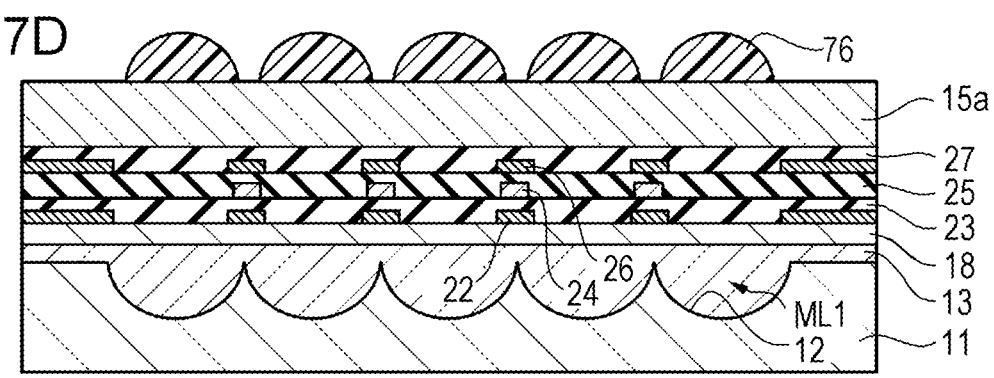

Next, the residual portions 75 in the resist layer 74 are softened (molten) through the reflow heating process. The molten portions 75 are in a flowing state and thus surfaces thereof are deformed into a curved-surface shape due to the action of surface tension. Therefore, as shown in FIG. 7D, spherical shape of convex portions 76, generated from the residual portions 75, are formed on the lens material layer 15a. The bottom side (lens material layer 15a side) of the convex portion 76 is a substantially rectangular shape in planar view, whereas the spherical shape of tip end side (upper side) thereof is formed into concentric shape in planar view. The convex portions 76 are formed separately from another.

Meanwhile, as a method for processing the portion 75 to make the convex portion 76, other methods other than the aforementioned reflow process may be used. For example, it is possible to process the portion 75 to make the convex portion 76 by using a method of exposing the light with a grayscale mask or an area gradation mask, a method of applying multi-step exposure, or the like.

Figure 8A:
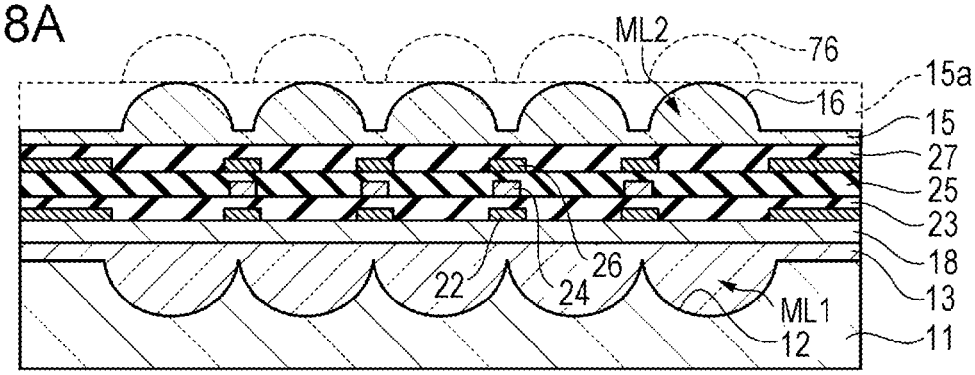
FIGS. 8A to 8D are a schematic cross-sectional view illustrating a manufacturing method of the element substrate according to the first embodiment.

Next, as shown in FIG. 8A, the convex portion 76 and the lens material layer 15a are subjected to anisotropic etching such as dry etching from the upper side. Accordingly, the convex portions 76 which are formed of the resist are gradually removed, and an exposed portion of the lens material layer 15a according to the removal of convex portions 76 is etched. Here, when the shape of the convex portion 76 is transferred to the lens material layer 15a, the etching process stops in a state where the lens material layer 15a remains between the convex portions 76 which are separated from one another.

As a result, the shape of the convex portion 76 is transferred to the lens material layer 15a and the lens layer 15 having a plurality of convex portions 16 (micro lens ML2) which are separated from one another is formed. The bottom side (insulating layer 27 side) of the convex portion 16 has a substantially rectangular shape in planar view, whereas the spherical shape of tip end side thereof is formed into concentric shape in planar view. In addition, in the anisotropic etching, it is possible to set the convex portion 76 and the convex portion 16 to be substantially the same shape as each other under the condition that the convex portion 76 (resist) and the lens material layer 15a (SiON) can be etched with substantially the same rate.

Subsequently, as shown in FIG. 5, the contact hole CH5 extending to the relay electrode 45 by penetrating the lens layer 15 and the insulating layer 27 is formed on the area, with which the relay electrode 45 overlaps in planar view, between the convex portions 16 which are separated from one another on the lens layer 15. Then, the relay electrode 46 is formed between the convex portions 16 which are separated from one another on the lens layer 15 to be electrically connected to the relay electrode 45 with the contact hole CH5 therebetween.

Figure 8B:
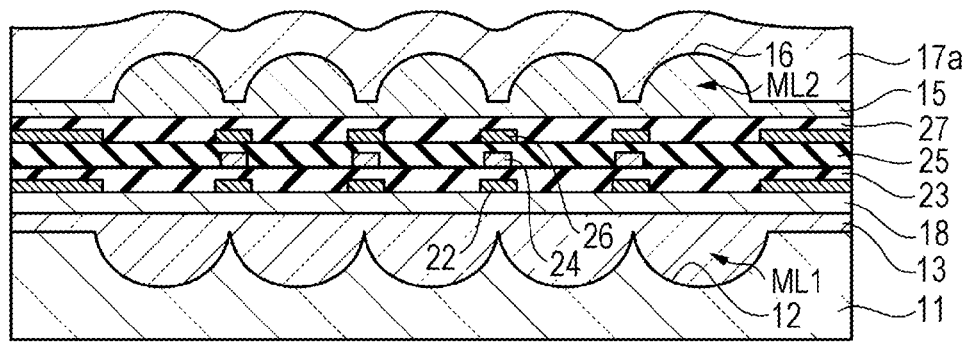

Next, as shown in FIG. 8B, a light-transmitting layer 17a, which is formed of an inorganic material such as SiO$_2$ having the light permeability and refractive index lower than that of the lens layer 15, is formed so as to cover the lens layer 15 having convex portions 16. The 17a can be formed by using the CVD method or the like. The light-transmitting layer 17a is formed so as to be accumulated on the lens layer 15 on which the convex portions 16 are formed and thus becomes an irregular shape reflected by the irregularity due to the convex portions 16.

Figure 8C:
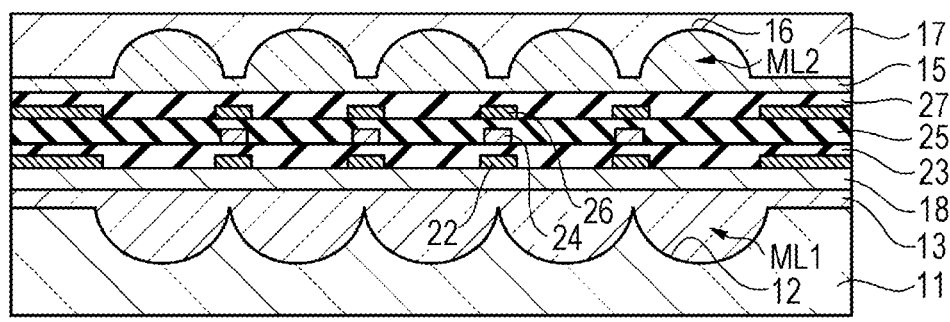

Next, the planarization process such as the CMP process is executed with respect to the light-transmitting layer 17a, thereby planarizing the top surface of the light-transmitting layer 17a. For this reason, as shown in FIG. 8C, the light-transmitting layer 17 of which the top surface is planarized is formed.

Next, as shown in FIG. 5, the contact hole CH6 extending to the relay electrode 46 by penetrating the light-transmitting layer 17 is formed on the area with which the relay electrode 46 of the light-transmitting layer 17 overlaps in planar view. Then, the pixel electrode 28 is formed on the light-transmitting layer 17 to be electrically connected to the relay electrode 46 with the contact hole CH6 therebetween.

Figure 8D:
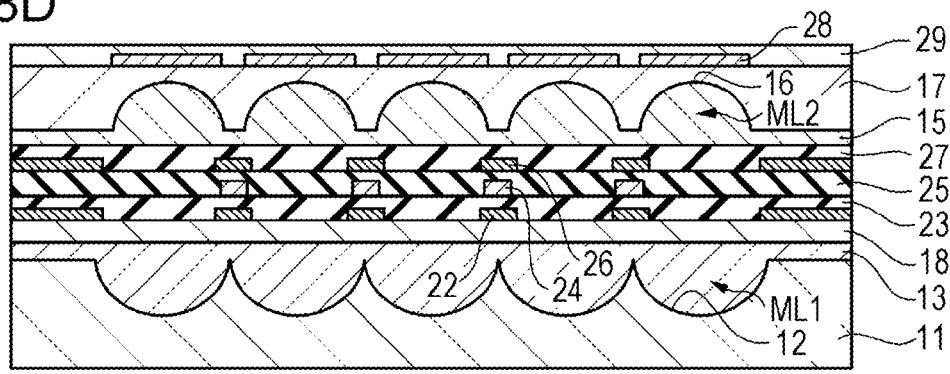

Next, the oriented film 29 is formed so as to cover the light-transmitting layer 17 and the pixel electrode 28 as shown in FIG. 8D. Accordingly, the element substrate 20 is completed.

The following processes will be described with reference to FIG. 3. Next, the counter substrate 30 is obtained by sequentially forming the light shielding layer 32, the protecting layer 33, the common electrode 34, and the oriented film 35 on the substrate 31 using a known technique.

An adhesive such as an epoxy resin (not shown) is disposed to be cured between the element substrate 20 and the counter substrate 30. Accordingly, the liquid crystal device 1 is completed by joining the element substrate 20 and the counter substrate 30 to each other. Meanwhile, the liquid crystal layer 40 may be disposed before joining the element substrate 20 and the counter substrate 30 to each other or may be sealed after joining.

Second Embodiment

The liquid crystal device according to the second embodiment is almost the same configuration as that of the first embodiment except that the micro lens ML1 and the micro lens ML2 in the element substrate are configured in a different way from each other. Here, the difference with respect to the first embodiment will be described. FIG. 9 is a schematic cross-sectional view illustrating the configuration of liquid crystal device according to the second embodiment. The same constituent elements as in the first embodiment are given the same reference numerals, and repeated description will be omitted.

Substrate for Electro-optical Apparatus

As shown in FIG. 9, a liquid crystal device 1A according to the second embodiment is provided with an element substrate 20A as the substrate for electro-optical apparatus. The element substrate 20A according to the second embodiment is provided with a micro lens ML1A as the first micro lens and a micro lens ML2A as the second micro lens on the substrate 11.

The micro lens ML1A has positive refractive power and a focus C of the micro lens ML1A is positioned to the liquid crystal layer 40 side upper than the curved surface of the convex portion 16 of the micro lens ML2A.

In the element substrate 20A according to the second embodiment, the lens layer 15A is formed of an inorganic material such as $SiO_2$, and the light-transmitting layer 17A is formed of an inorganic material such as SiON having the optical refractive index higher than that of the lens layer 15A. With this configuration, the micro lens ML2A has the negative refractive power. Therefore, the focus of the micro lens ML2A (not shown) is positioned on the side (micro lens ML1A side) on which the light is incident, and the light incident on the micro lens ML2A is refracted so as to radially spread from the focus of the micro lens ML2. Note that the optical axis of the micro lens ML2A approximately matches with optical axis Ax of the micro lens ML1A.

On the outside further than the planar center of the micro lens ML1A, if the light L1, which is incident on the peripheral edge part of the micro lens ML1A from the area overlapping with the light shielding layer 22 in planar view, is refracted toward the focus C positioned on the side upper than the micro lens ML2A. Accordingly, in the liquid crystal device 1A according to the second embodiment similar to the first embodiment, since the light L1 which is shielded in the light shielding layer 22 passes through the liquid crystal layer 40 by being incident into the opening 22a, the use efficiency of light can be improved.

If The light L1 condensed by the micro lens ML1A goes straight, the light L1 is inclined in the oblique direction with respect to the optical axis Ax and thus the liquid crystal layer 40 advances in the oblique direction with respect to an alignment direction of liquid crystal molecules as shown by a dashed line. As a result, a decrease in transmittance of the light transmitting the liquid crystal layer 40 causes a reduction in contrast of the liquid crystal device 1A.

In the liquid crystal device 1A according to the second embodiment, since the micro lens ML2A has the negative refractive power, the light L1 refracted toward the focus C in the micro lens ML1A is refracted outward with respect to the optical axis Ax in the micro lens ML2A before extending to the focus C. This refraction causes an angle of inclination of the light L1 with respect to an alignment direction of the liquid crystal molecules to be smaller, and thus the decrease in transmittance of the light transmitting the liquid crystal layer 40 is suppressed to improve the contrast of the liquid crystal device 1A. Therefore, according to a configuration of element substrate 20A provided in the electro-optical apparatus 1A, it is possible to improve the use efficiency of the light and the contrast similar to the case in the first embodiment.

Meanwhile, the focus position of the micro lens ML1A can be adjusted depending on the shape of the concavity 12 (depth, curvature of the curved surface, or the like) or the thickness of the lens layer 13 and the optical path length-adjusting layer 18. In addition, the micro lens ML2A can be configure to have the negative refractive power by increasing the optical refractive index of the light-transmitting layer 17A compared to that of the lens layer 15A.

Third Embodiment

The liquid crystal device according to the third embodiment is provided with a first substrate having the micro lens ML1, and a second substrate having the micro lens ML2 on the element substrate, and is almost the same configuration as that of the first embodiment except that the first substrate and the second substrate are joined to each other via the adhesive layer. Here, the difference with respect to the first embodiment will be described. FIG. 10 is a schematic cross-sectional view illustrating the configuration of liquid crystal device according to the third embodiment. The same constituent elements as in the first embodiment are given the same reference numerals, and repeated description will be omitted.

Substrate for Electro-optical Apparatus

As shown in FIG. 10, a liquid crystal device 1B according to the third embodiment is provided with an element substrate 20B as the substrate for electro-optical apparatus. The element substrate 20B according to the third embodiment is provided with the substrate 11 as the first substrate, a substrate 21 as the second substrate, and an adhesive layer 19 which adhesively fix the substrate 11 and the substrate 21 to each other. The micro lens ML1 is configured by providing the concavity 12 on the substrate 11 and forming the lens layer 13 so as to embed the concavity 12.

Similar to the substrate 11, the substrate 21 is formed of a material having light permeability such as glass or quartz. The substrate 21 is provided with the light shielding layer 22 and the insulating layer 23, the TFT 24, the insulating layer 25, the light shielding layer 26, the insulating layer 27, the lens layer 15 having the convex portions 16 (micro lens ML2), the light-transmitting layer 17, the pixel electrode 28, and the oriented film 29. The adhesive layer 19 is formed of an adhesive such as a silicone resin.

In the configuration of the liquid crystal device 1B according to the third embodiment, the use efficiency of light can be improved by reducing an amount of the light being shielded in the light shielding layer 22 among the incident light from the element substrate 20B side due to condensing efficiency of the micro lens ML1. In addition, the optical axis of the condensed light in the micro lens ML1 can be closer to the high contrast axis direction than in the micro lens ML2 so as to be incident on the liquid crystal layer 40. Therefore, similar to the first embodiment, it is possible to provide the liquid crystal device 1B capable of improving the use efficiency of the light and the contrast.

Manufacturing Method of Substrate for Electro-optical Apparatus

Next, regarding the manufacturing method of the element substrate 20B according to the third embodiment, the difference with respect to the first embodiment will be described. Drawings will not be shown in detail. In the first embodiment, since the TFT 24 is formed on the micro lens ML1 after forming the micro lens ML1 on the substrate 11, the micro lens ML1 is heated at a high temperature in the process of forming the TFT 24. Accordingly, the substrate 11 and the lens layer 13 which configure the micro lens ML1 need to use a material capable of withstanding high temperature at the time of forming the TFT 24.

On the other hand, in the third embodiment, since the substrate 11 having the micro lens ML1 formed thereon and the substrate 21 having the TFT 24 formed thereon are separately formed, the micro lens ML1 is not exposed to the high temperature when the substrate 11 and the lens layer 13 which configure the micro lens ML1 form the TFT 24. Therefore, it is possible to use a resin material or a material having a slightly low high-temperature resistance with respect to the substrate 11 and the lens layer 13. In addition, even in a case of using a material having high-temperature resistance, it is possible to avoid a risk of quality degradation such as crack initiation which may occur due to heating at high temperature or temperature change.

Moreover, in a case where the liquid crystal device 1B is used as an optical modulator (liquid crystal light valve) of a projection type display device (projector), it is possible to allow the substrate 11 to function as a dust-proof glass by appropriately setting the thickness of the substrate 11. The dust-proof glass is used so as to make the shadow of dust, generated when the light is projected to the image, inconspicuous by being positioned shifted from the focus position of the projector regardless of the dust attached on the surface thereof. With the substrate 11 having a function as the dust-proof glass, it is possible to reduce the number of components in the manufacturing of the projector and reduce the number of associated manufacturing processes as well.

Meanwhile, in the third embodiment, the substrate 21 serves as the role of the optical path length-adjusting layer 18 in the first embodiment. Therefore, in order to adjust the focus of the micro lens ML1 to a predetermined position, it is preferable that the thickness of the substrate 21 be appropriately selected or the substrate 21 be polished to appropriately adjust the thickness thereof.

Fourth Embodiment

Electronic Equipment

Figure 11:
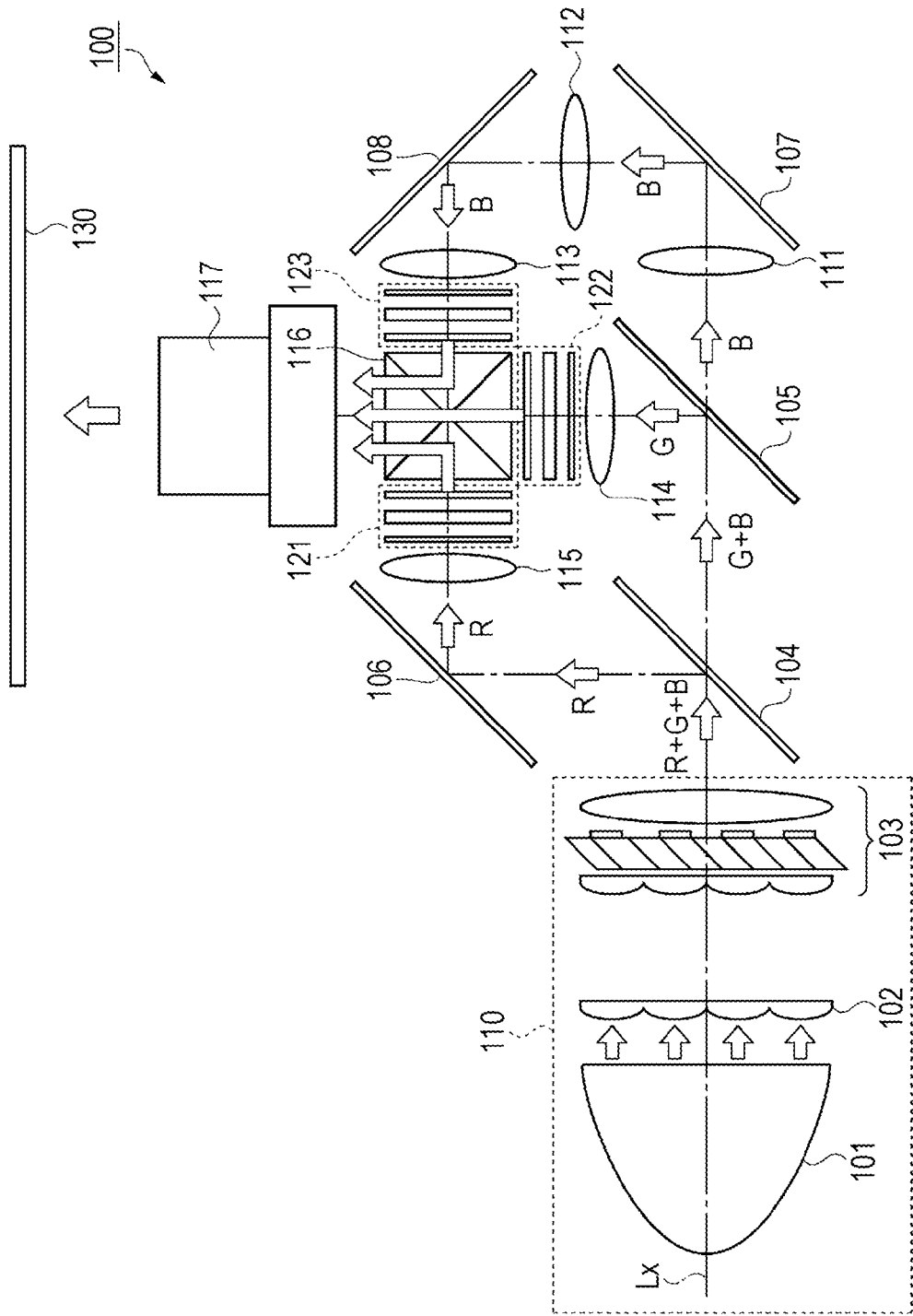
FIG. 11 is a schematic view illustrating a configuration of a projector as electronic equipment according to a fourth embodiment.

Next, electronic equipment according to the fourth embodiment will be described with reference to FIG. 11. FIG. 11 is a schematic view illustrating a configuration of a projector as the electronic equipment according to the fourth embodiment.

As shown in FIG. 11, a projector 100 (optical modulator) as the electronic equipment according to the fourth embodiment is provided with a polarization illumination device 110, two dichroic mirrors 104 and 105 as a light separating device, three reflecting mirrors 106 to 108, five relay lenses 111 to 115, three liquid crystal light valves 121 to 123, a cross dichroic prism 116 as a photosynthetic element, and a projection lens 117.

The polarization illumination device 110 is provided with a lamp unit 101, as a light source, which is formed of a white light source such as an ultrahigh pressure mercury lamp or a halogen lamp, an integrator lens 102, and a polarization conversion element 103. The lamp unit 101, the integrator lens 102, and the polarization conversion element 103 are disposed along a system optical axis Lx.

The dichroic mirror 104 reflects red light (R) and transmits green light (G) and blue light (B) among the polarized light beams emitted from the polarization illumination device 110. The other dichroic mirror 105 reflects the green light (G) which passes through the dichroic mirror 104, and transmits the blue light (B).

The red light (R) which is reflected by the dichroic mirror 104 is incident on the liquid crystal light valve 121 via the relay lens 115 after being reflected by the reflecting mirror 106. The green light (G) which is reflected by dichroic mirror 105 is incident on the liquid crystal light valve 122 via the relay lens 114. The blue light (B) which passes through the dichroic mirror 105 is incident on the liquid crystal light valve 123 via a light guide system configured to have three relay lenses 111 to 113 and two reflecting mirrors 107 and 108.

The transmission type of liquid crystal light valves 121 to 123, as the light modulation element, are respectively disposed to face the incident plane for each color light of the cross dichroic prism 116. The color light incident on the liquid crystal light valves 121 to 123 is modulated on the basis of image information (image signal) and emitted toward the cross dichroic prism 116.

The cross dichroic prism 116 is configured to have four rectangular prisms which are joined together, in which a dielectric multilayer film for reflecting the red light and a dielectric multilayer film for reflecting the blue light are formed in a cross shape on the inner surface. The three color light beams are synthesized by these dielectric multilayer films to synthesize light representing a color image. The synthesized light is projected onto a screen 130 by the projection lens 117 as a projection optical system, and then the image is enlarged to be displayed.

The liquid crystal light valve 121 is applied by one of the liquid crystal devices 1, 1A, and 1B of the above described embodiments. The liquid crystal light valve 121 is disposed in a gap between a pair of polarizing elements which are arranged in a cross-nicol alignment in the incident side and the emitted side of the color light. Other liquid crystal light valves 122 and 123 are disposed in the same manner as described above.

According to a configuration of the projector 100 in the fourth embodiment, even though a plurality of pixels P is arranged with high definition, since the liquid crystal devices 1, 1A, and 1B which have the bright light with the high use efficiency of light, the high contrast of the image projected on the screen 130, and less vignetting of the projection lens are provided, it is possible to provide the bright projector 100 with high quality.

The embodiments described above are only for describing an aspect of the invention and thus can be arbitrarily modified and applied within the scope of the invention. As modification examples, the following can be considered, for example.

MODIFICATION EXAMPLE 1

Figure 12:
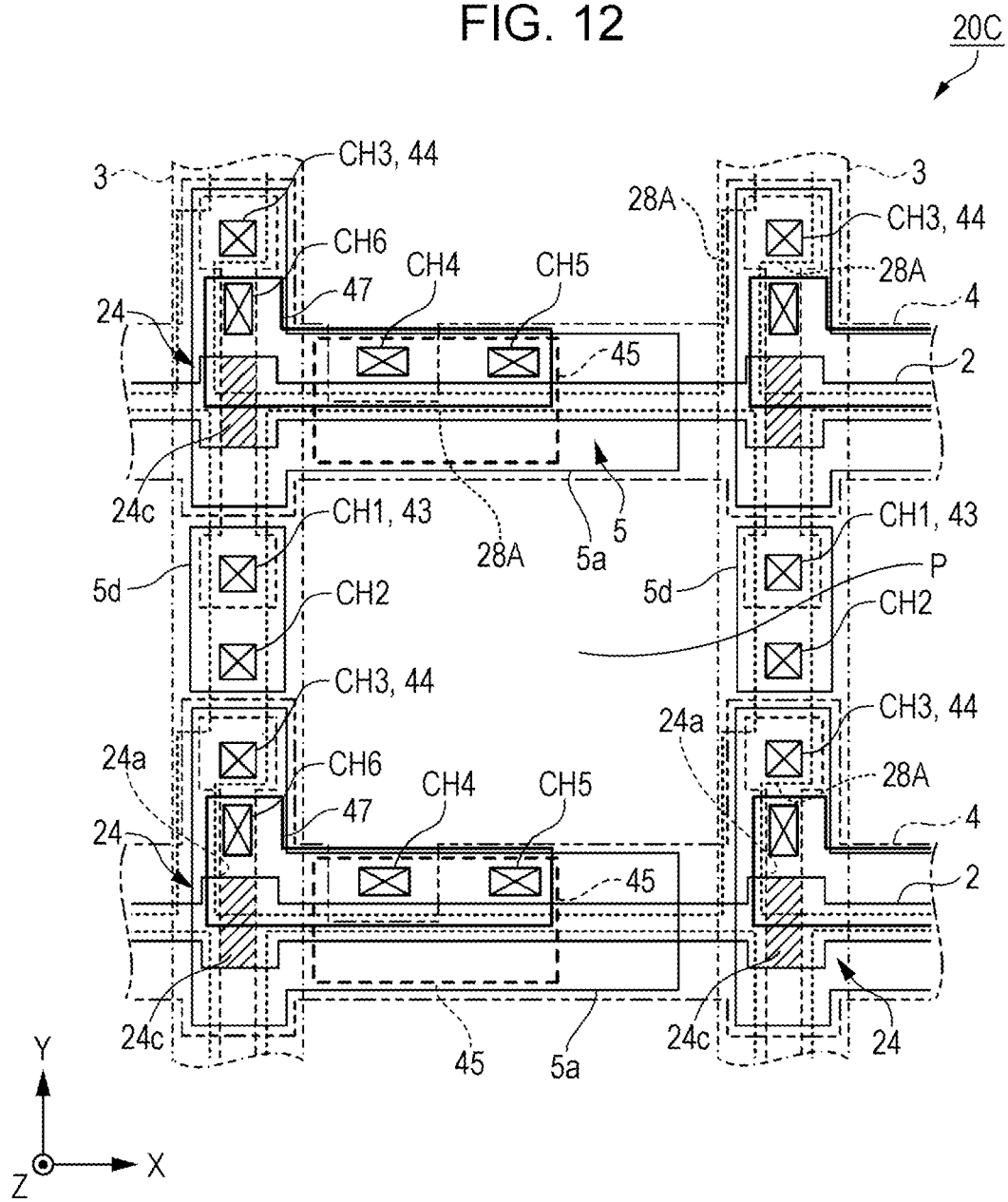
FIG. 12 is a schematic plan view illustrating a configuration of an element substrate according to Modification Example 1.

The liquid crystal devices 1, 1A, and 1B according to the above described embodiments have a configuration in which the contact hole CH6 for electrically connecting the pixel electrode 28 and the TFT 24 to each other is disposed substantially at the center of one side of the pixel electrode 28 along the scanning line 2; however, the invention is not limited thereto. For example, it may be a configuration in which the contact hole CH6 is disposed at a corner of the pixel electrode 28. For example, the contact hole CH6 may be positioned on a diagonal line of openings 22a and 26a or a diagonal line of the pixel electrode 28. FIG. 12 is a schematic plan view illustrating a configuration of an element substrate according to Modification Example 1.

As shown in FIG. 12, in the element substrate 20C according to Modification Example 1, the contact hole CH6 is disposed at the corner (on diagonal line) of the pixel electrode 28A which is formed into a substantially rectangular shape. In other words, the contact hole CH6 is disposed on the diagonal line of the openings 22a and 26a of the light shielding layers 22 and 26 (refer to FIG. 3) which are the areas of the pixel P. Accordingly, the relay electrode 47 which is electrically connected to the contact hole CH6 and does not allow light to pass therethrough is also disposed on the diagonal line of the area of the pixel P. The relay electrode 47 is provided so as not to overlap with the convex portion 16 in planar view on the lens layer 15 (refer to FIG. 10) having the same layer as the micro lens ML2 (convex portion 16).

Here, as described above, the bottom side of the convex portion 16 is a substantially rectangular shape in planar view, whereas the spherical shape of tip end side thereof is formed into a concentric shape in planar view. Among the convex portions 16, a portion formed into a concentric shape in planar view functions as a lens, and the corner in the substantially rectangular shape is a portion that almost does not function as a lens. Therefore, as in the first embodiment, when the relay electrode 46 is disposed substantially at the center of the one side of the pixel electrode 28 (refer to FIG. 4), the number of portions, which function as a lens in a concentric shape among the convex portions 16, becomes smaller with respect to the pixel electrode 28 in order to avoid the relay electrode 46.

On the other hand, when the relay electrode 47 is disposed at the corner of the pixel electrode 28A as in Modification Example 1, it is possible to avoid the relay electrode 47 by having a shaved part from a corner of the substantially rectangular shape among the convex portions 16 without reducing the number of portions which function as a lens in a concentric shape. That is, the planar shape of the micro lens ML2 with respect to the pixel electrode 28 may be larger than that of the first embodiment. Thus, it is possible to further improve the use efficiency of the incident light.

The planar shape of the micro lens ML2 (convex portion 16) may be configured to be a substantially circular shape by including the bottom side. The planar shape of the micro lens ML2 having a substantially circular shape (convex portion 16) can be formed by making a planar shape of the portion 75 a substantially circular shape in the process of forming the portion 75 by exposing the resist layer 74 shown in FIG. 7C.

MODIFICATION EXAMPLE 2

The liquid crystal devices 1, 1A, and 1B according to the above described embodiments have a configuration in which the light shielding layers 22 and 26 have the openings 22a and 26a which are formed into a lattice shape; however, the invention is not limited thereto. The light shielding layers 22 and 26 may not be formed into a lattice shape, for example, may be configured so that the light shielding layers 22 and 26 are partially separated. Even with such a configuration, it is possible to realize the same effect as in the above described embodiment.

MODIFICATION EXAMPLE 3

The liquid crystal devices 1, 1A, and 1B according to the above described embodiments have a configuration in which the micro lens ML1 is formed into a convex shape downward, and the micro lens ML2 is formed into a convex shape upward; however, the invention is not limited thereto. For example, at least one of the micro lens ML1 and the micro lens ML2 may be formed into the convex shape on the side opposite to the above described embodiments. Even with such a configuration, it is possible to realize the same effect as in the above described embodiment.

MODIFICATION EXAMPLE 4

The liquid crystal devices 1, 1A, and 1B according to the above described embodiments have a configuration in which the micro lenses ML1 and ML2 are formed into a substantially spherical shape; however, the invention is not limited thereto. For example, the micro lenses ML1 and ML2 may be configured to have a curved-surface shape portion, a tapered portion or a flat portion.

MODIFICATION EXAMPLE 5

The liquid crystal devices 1, 1A, and 1B according to the above described embodiments have a configuration in which the micro lenses ML1 and ML2 are arranged in a matrix; however, the invention is not limited thereto. In response to the arrangement of the pixel P, the micro lenses ML1, ML2 may be differently arranged, for example, in a honeycomb form.

MODIFICATION EXAMPLE 6

The electronic equipment which is applicable to the liquid crystal devices 1, 1A, and 1B according to the above described embodiments is not limited to the projector 100. The liquid crystal devices 1, 1A, and 1B can be preferably used as a display of information terminal equipment. For example, a projection type of head-up display (HUD) or a direct-view head mounted display (HMD), an E-book, a personal computer, a digital still camera, an LCD TV, a viewfinder or monitor type of video recorder, a car navigation system, an electronic organizer, and a POS terminal may be used.

The entire disclosure of Japanese Patent Application No. 2013-164822, filed Aug. 8, 2013 is expressly incorporated by reference herein.

What is claimed is:

1. A substrate for electro-optical apparatus comprising:
    a first substrate;
    a pixel electrode;
    a switching element that is provided between the first substrate and the pixel electrode so as to correspond to the pixel electrode, and includes a semiconductor layer having a channel area;
    a first light shielding layer that is provided between the first substrate and the switching element, has an opening in an area overlapping with the pixel electrode in planar view, and is disposed in an area overlapping with the channel area;
    a second light shielding layer that is provided between the switching element and the pixel electrode, has an opening in an area overlapping with the pixel electrode in planar view, and is disposed in the area overlapping with the channel area;
    a first lens that is disposed between the first substrate and the first light shielding layer, and is disposed in an area overlapping with the pixel electrode in planar view; and
    a second lens that is disposed between the second light shielding layer and the pixel electrode, and is disposed in an area overlapping with the pixel electrode in planar view,
    wherein
        the first lens has positive refractive power, and
        the second lens has positive refractive power when a focus of the first lens is positioned closer to a first substrate side than the second lens and has negative refractive power when the focus of the first lens is positioned closer to a pixel electrode side than the second lens.

2. The substrate for electro-optical apparatus according to claim 1,
    wherein the pixel electrode in a planar shape is formed into a substantially rectangular shape, and a contact portion for electrically connecting the pixel electrode to the switching element is disposed in a corner of the pixel electrode in planar view.

3. The substrate for electro-optical apparatus according to claim 2, further comprising:
a relay electrode that is provided between the contact portion and the switching element,
wherein the relay electrode is disposed on the same layer as the second lens or disposed closer to the pixel electrode side than the second lens.

4. The substrate for electro-optical apparatus according to claim 3,
wherein the relay electrode is disposed in the corner of the pixel electrode in planar view.

5. The substrate for electro-optical apparatus according to claim 2,
wherein the second lens is thinner than the first lens.

6. The substrate for electro-optical apparatus according to claim 2,
wherein a distance between the second light shielding layer and the second lens is smaller than a distance between the first light shielding layer and the first lens.

7. The substrate for electro-optical apparatus according to claim 2,
wherein a diameter of the first lens is equal to or larger than that of the second lens.

8. The substrate for electro-optical apparatus according to claim 1, further comprising:
a second substrate,
wherein the first lens is provided on the first substrate,
the first light shielding layer, the switching element, the second light shielding layer, and the second lens are disposed on the second substrate, and
the first substrate and the second substrate are joined to each other via an adhesive layer which is disposed between the first lens and the second substrate.

9. An electro-optical apparatus including the substrate for the electro-optical apparatus as an element substrate according to claim 1, the apparatus comprising:
the element substrate disposed on a light incident side;
a counter substrate disposed to face the element substrate and provided with a common electrode on a surface of the element substrate side; and
an electro-optical layer disposed between the element substrate and the counter substrate.

10. Electronic equipment including the electro-optical apparatus according to claim 9.

11. The substrate for electro-optical apparatus according to claim 1,
wherein a focus of the second lens is positioned closer to the pixel electrode side than the first lens when the second lens has positive refractive power.

12. An electro-optical apparatus comprising:
a pixel electrode;
a switching element that is provided to correspond to the pixel electrode and includes a semiconductor film having a channel area;
a first light shielding layer that is provided on a side of the switching element opposite to the pixel electrode and disposed so as to overlap with the channel area;
a second light shielding layer that is provided between the switching element and the pixel electrode and disposed so as to overlap with the channel area in planar view;
a first lens that is provided on a side of the first light shielding layer opposite to the switching element and disposed so as to overlap with the pixel electrode in planar view; and
a second lens that is provided between the second light shielding layer and the pixel electrode and disposed so as to overlap with the pixel electrode in planar view,
wherein
the first lens has positive refractive power, and
the second lens has positive refractive power when a focus of the first lens is positioned closer to a switching element side than the second lens and has negative refractive power when the focus of the first lens is positioned closer to a pixel electrode side than the second lens.

\* \* \* \* \*